United States Patent [19]

Soleymani et al.

[11] Patent Number: 5,587,939
[45] Date of Patent: Dec. 24, 1996

[54] HALF-BAND FILTER FOR A CELLULAR GROUP DEMULTIPLEXER

[75] Inventors: Mohammad R. Soleymani, Beaconsfield; Yousef Shayan, Kirkland, both of Canada

[73] Assignee: Spar Aerospace Limited, Mississauga, Canada

[21] Appl. No.: 608,940

[22] Filed: Feb. 29, 1996

Related U.S. Application Data

[63] Continuation of Ser. No. 249,143, May 25, 1994, abandoned.

[30] Foreign Application Priority Data

May 2, 1994 [CA] Canada .................................. 2122652

[51] Int. Cl.⁶ .................................................. G06F 17/10
[52] U.S. Cl. ........................................................ 364/724.16
[58] Field of Search ............................ 364/724.16, 724.13; 370/70, 123

[56] References Cited

U.S. PATENT DOCUMENTS

| | | | |
|---|---|---|---|
| 4,785,447 | 11/1988 | Ichiyoshi | 370/70 |
| 4,792,943 | 12/1988 | Göckler | 370/70 |
| 4,839,889 | 6/1989 | Göckler | 370/70 |
| 4,896,320 | 1/1990 | Göckler | 370/123 |
| 4,953,118 | 8/1990 | Göckler | 364/724.13 |
| 5,177,700 | 1/1993 | Göckler | 364/724.13 |
| 5,268,905 | 12/1993 | Soloff et al. | 370/70 |
| 5,293,382 | 3/1994 | Carson et al. | 370/123 |
| 5,299,192 | 3/1994 | Guo et al. | 370/70 |

OTHER PUBLICATIONS

"Digital TDM–FDM translator with multistage structure", IEEE Transactions on Communications, vol. COM–26, No. 5, May 1978, pp. 734–741, Tsuda et al.

*Multirate Digital Signal Processing*, Crochiere et al, pp. 155–235, Prentice–Hall, Inc.

Primary Examiner—David H. Malzahn
Attorney, Agent, or Firm—Chilton, Alix & Van Kirk

[57] ABSTRACT

A half-band filter for cellular group demultiplexer has a top half and a symmetrical bottom half. Each half consists of a plurality of shift registers, adders and multipliers connected in serial arrangement so as to produce a desired result at the output whereby the number of multipliers is reduced relative to the amount of multipliers in a conventional half-band filter.

13 Claims, 17 Drawing Sheets

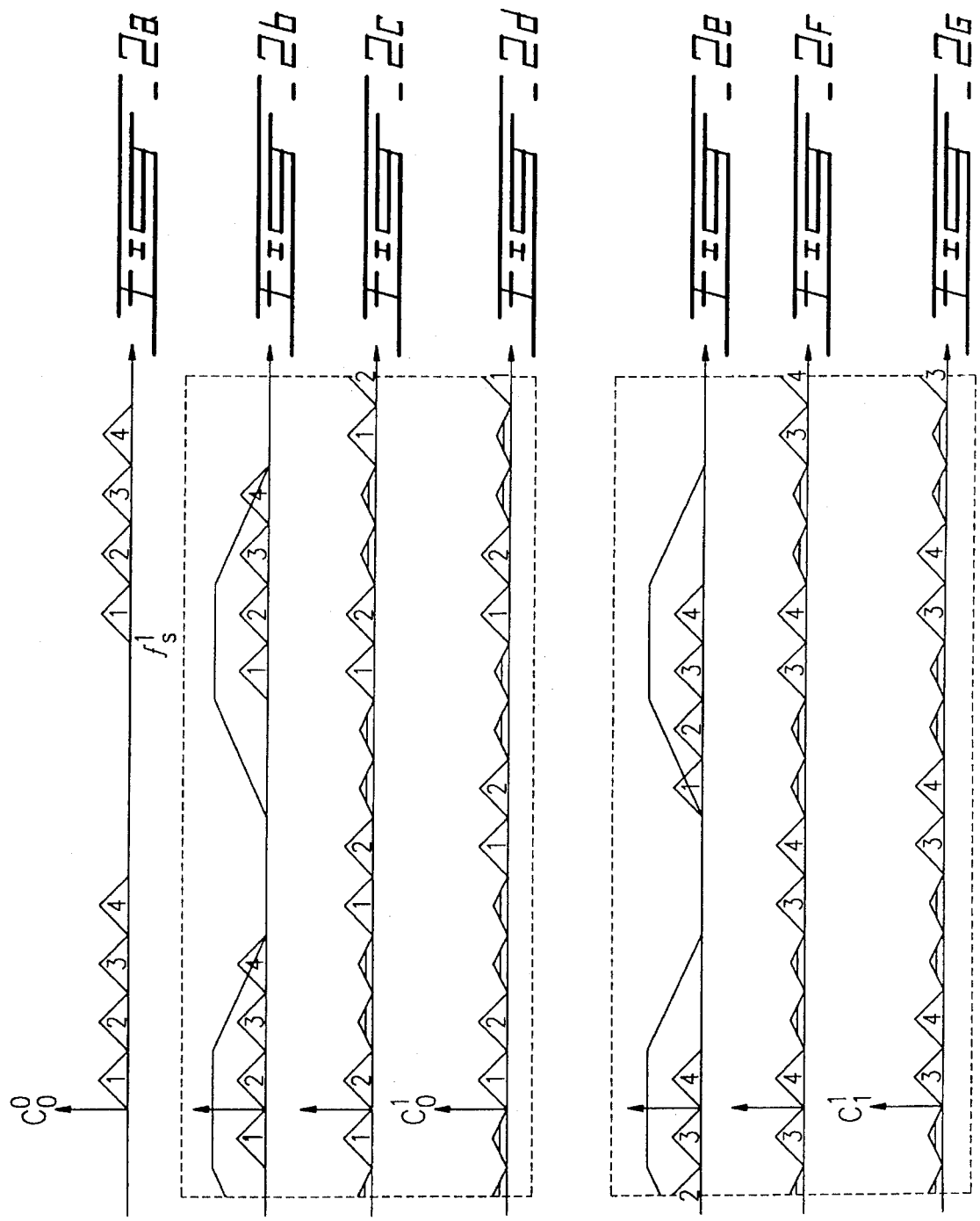

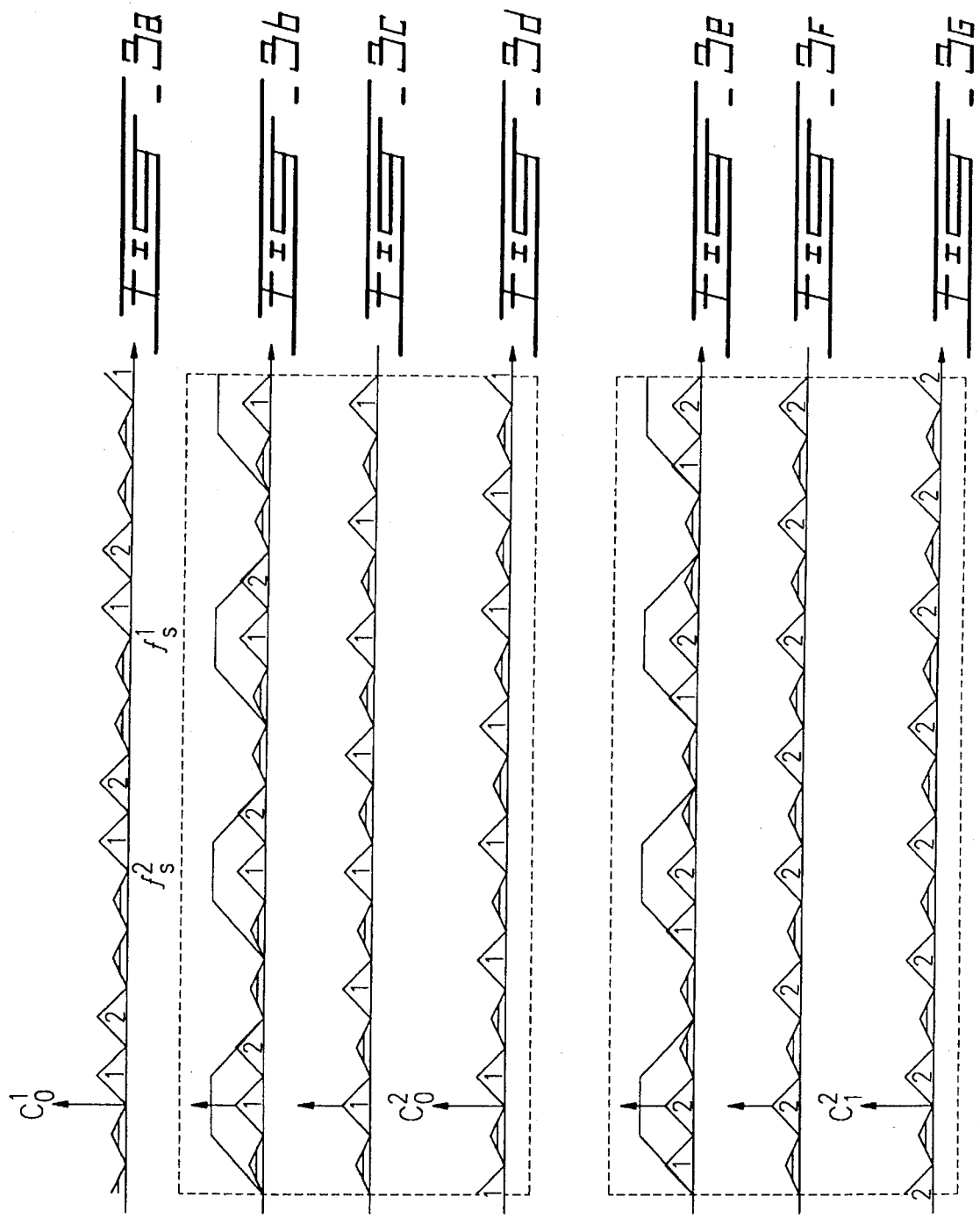

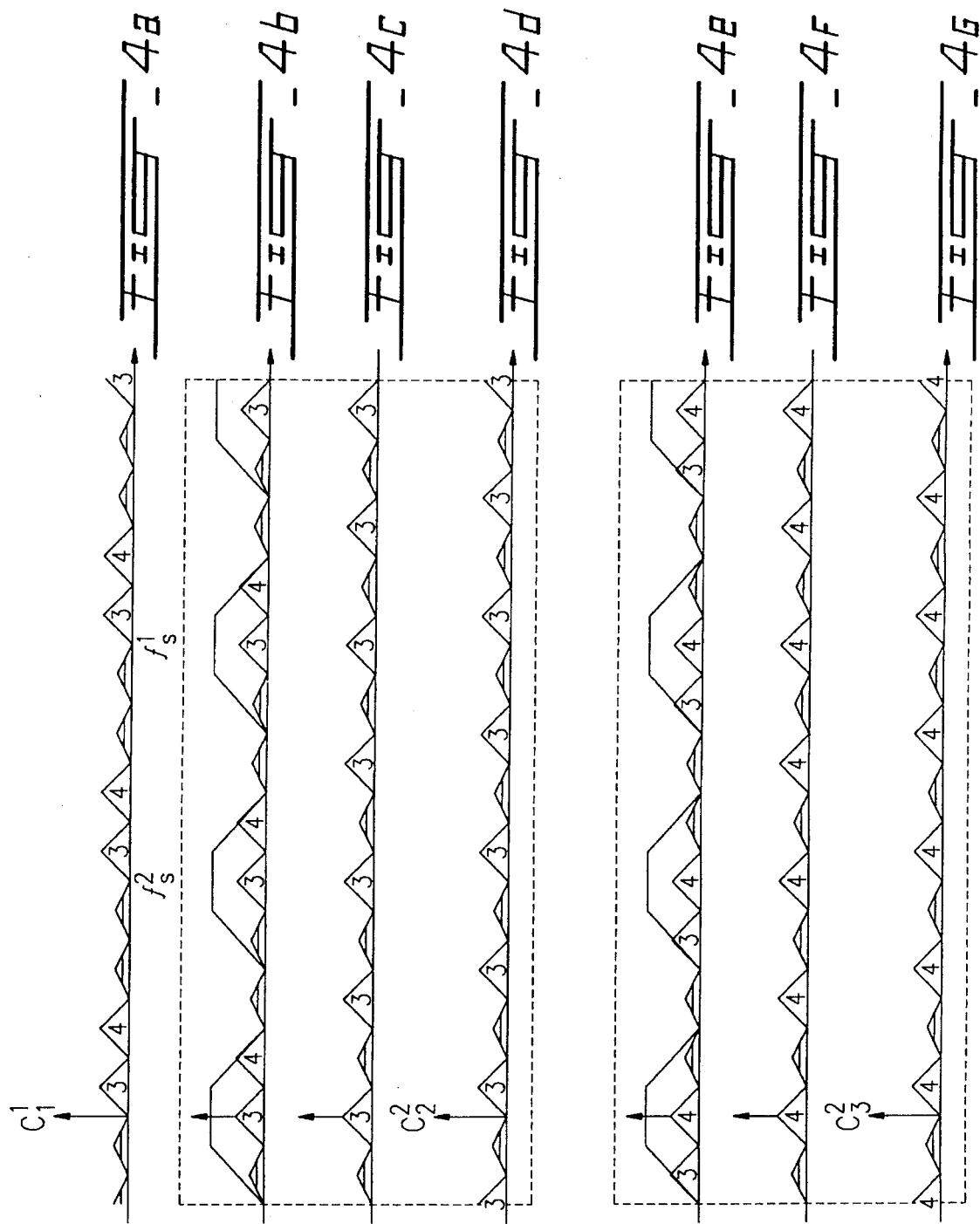

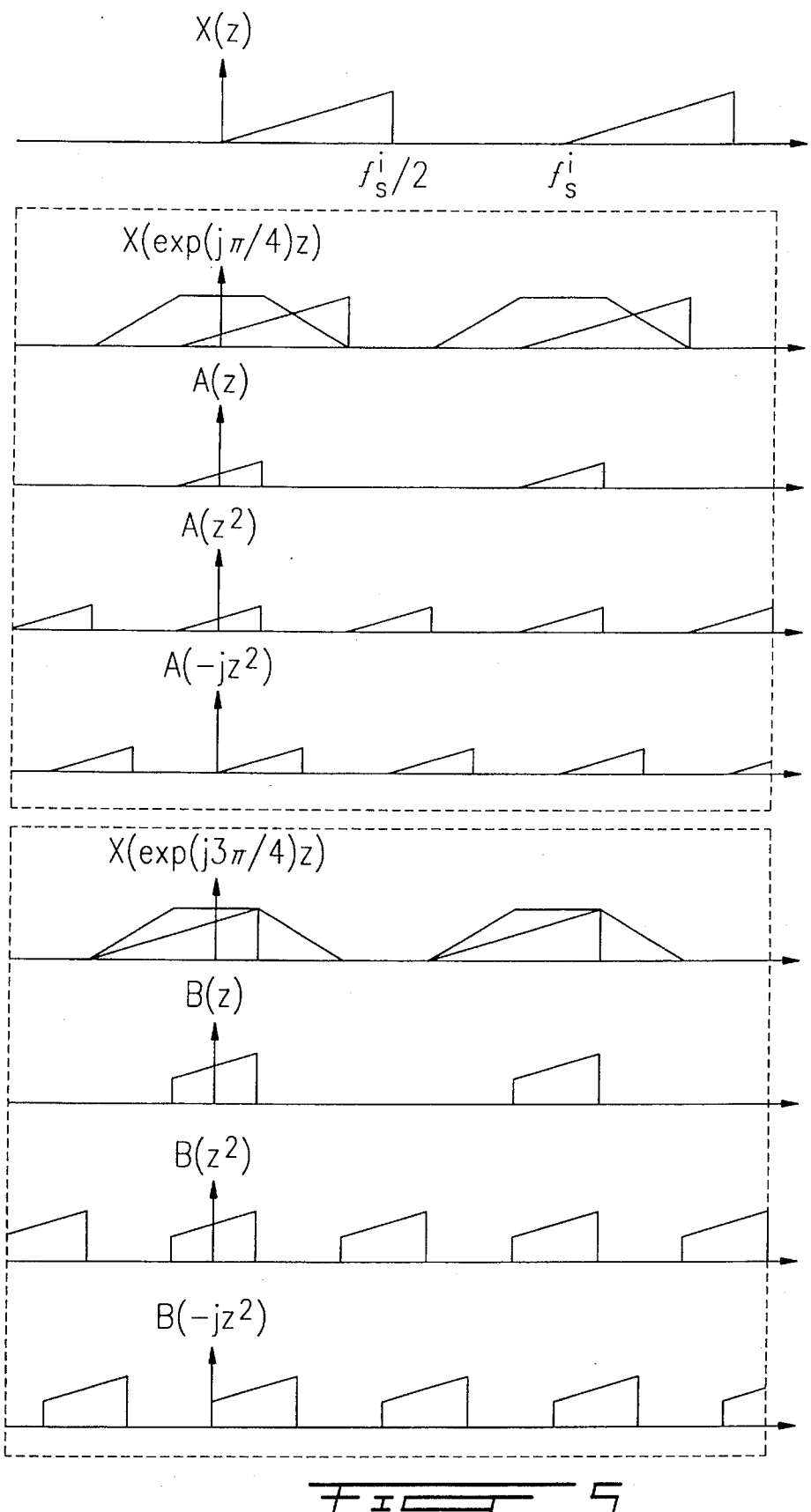

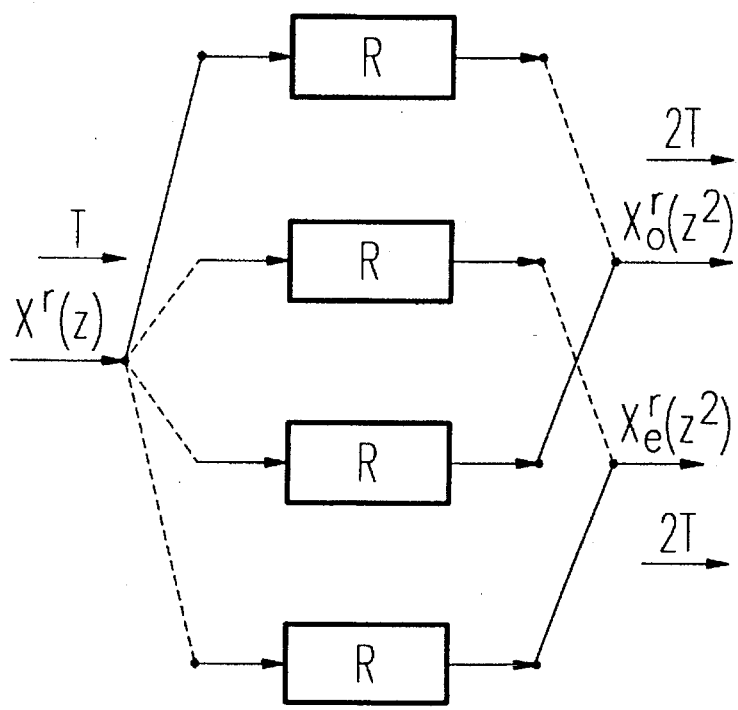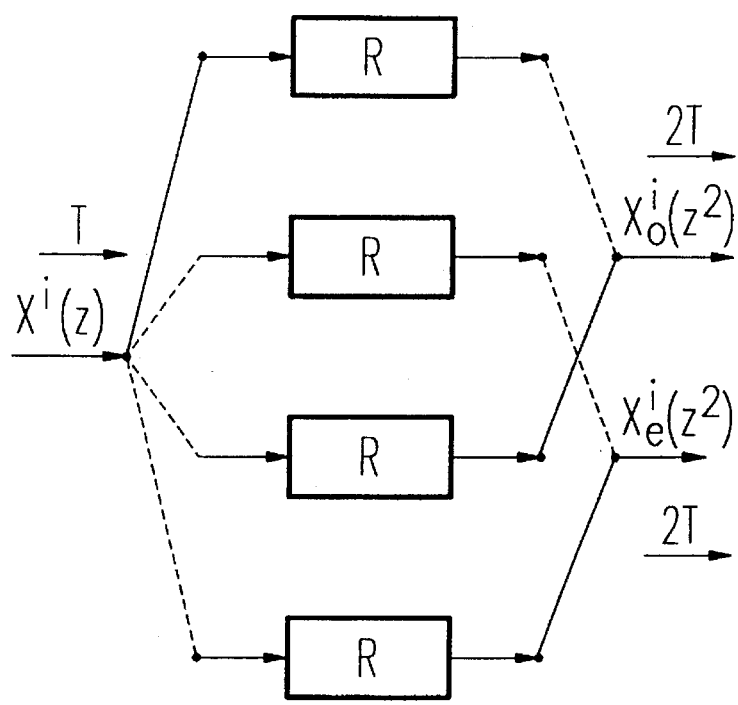
FIG. 10

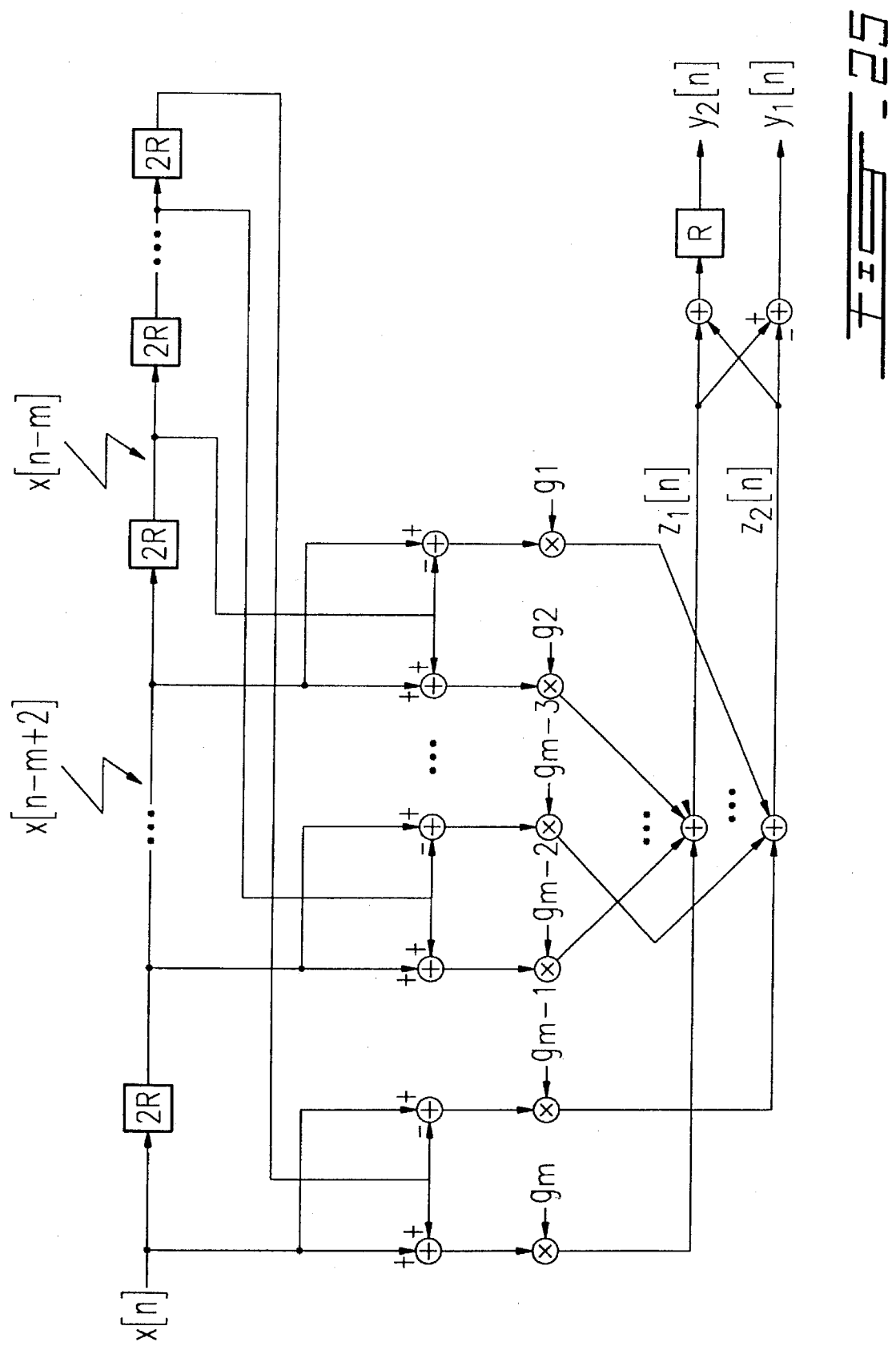

HALF-BAND FILTER FOR A CELLULAR GROUP DEMULTIPLEXER

This application is a continuation of application Ser. No. 08/249,143 filed on May 25, 1994, now abandoned.

BACKGROUND OF THE INVENTION

1. Field of the Invention

The invention relates to a half-band filter for a cellular group demultiplexer. More specifically, the invention relates to such a half-band filter denoted by the generic name splitter.

Even more specifically, the invention relates to improvements in such splitters.

In accordance with the invention, there is provided splitters which use a smaller number of multipliers than conventional splitters.

2. Description of Prior Art

The use of satellites with multiple spot beam is a major step in increasing the capabilities of satellite communication. Multiple beam satellites have the advantage of having high gain and allowing the reuse of the same frequency band in geographically separated beams. The use of multiple spot beams will require additional switching on-board the satellite. This switching can be done either in the RF, IF or the baseband. Switching at the RF and IF will necessitate the use of Time Division Multiple Access (TDMA) in the uplink which could lead to high rate modems in the earth stations. This could increase the cost of earth stations. On-board switching in the baseband requires down-conversion, demultiplexing and demodulation of the uplink data prior to switching and re-multiplexing, remodulation and upconversion after switching to form the downlink. The part of the signal processing in the baseband is called On-board Baseband Processing (OBP). The use of the OBP results in a considerable flexibility in the choice of the access scheme and either TDMA or Frequency Division Multiple Access (FDMA) can be used. For the payloads with OBP, the use of FDMA is considered on the uplink to reduce ground station cost. On the other hand, Time Division Multiplexing (TDM) is used for its power efficiency on the downlink.

Use of FDMA on the uplink will reduce the size of the earth terminal as compared to TDMA. However, the price paid is the increased complexity of the spacecraft payload. While a single demodulator is sufficient for demodulation of high bit rate TDMA on the uplink, several demodulators are required for the demodulation of the FDMA carriers received by the satellite. A solution to this problem is the use of a multi-carrier demodulator, referred to as a group demultiplexer/demodulator. The more important and computational intensive section, referred to as the group demultiplexer, divides the incoming composite spectrum into separate channels. The second section, the demodulator, recovers the digital data for each individual channel.

There are several techniques for the group demultiplexer design. A straightforward method is per-channel filtering. In this method, a separate filter is used for each channel. This is only feasible for a small number of channels. For a large number of channels sharp filters with many taps are required. Another method is the FFT/IFFT or, frequency-domain filtering. In this method, a Fast Fourier Transform (FFT) is used to find the frequency spectrum of the composite FDM signal. Following the FFT, the frequency-domain coefficients are multiplied by coefficients of a filter in order to determine the frequency-domain samples falling into each of the carrier channels. For each set of frequency-domain coefficients, an Inverse FFT (IFFT) is used to recover the time-domain samples of the modulated carriers. This method is much less complex than the per-channel approach, while having a great degree of flexibility.

Another method for the implementation of the group demultiplexer is the polyphase/FFT method. In this method, a digital filter bank is implemented in cascade with an FFT processor. This technique can be used when the bandwidths of the channels are equal and fixed. There is another technique, called tree or multistage group demultiplexer. In the tree group demultiplexer technique, a set of filters is arranged in a tree structure (usually a binary tree). The number of channels demultiplexed by the binary tree is a power of 2 (a power of q if q-ary tree is used). The demultiplexer makes use of filters to split the number of channels into two (q in general) at each node of the tree. After successive stages of filtering and decimation, the channels are demultiplexed. An important property of the multistage demultiplexer is its modularity, due to the fact that the filters are replicated in each stage. With this demultiplexer, it is possible to obtain, from the intermediate stages, channels with wider bandwidths. Recently, several authors have introduced different architectures for the tree demultiplexer. However, for the most part, these different structures constitute the description of the same principles in different ways.

In this application a new structure for the demultiplexer based on the time multiplexing of a unique single cell is introduced. This structure, while using the idea of a two way channelizer, is different in many respects from previously proposed schemes. In this section, we present the basics of the new cellular demultiplexer. The group demultiplexer is intended to transform a single input consisting of N frequency multiplexed signals into N time signals at its output, each corresponding to one of the components of the input signal. The proposed group demultiplexer does this in several stages. In each stage the number of channels at the output is twice the number of channels at the input, while the bandwidth of each channel is half that of the individual input channels. Because of this binary splitting of the channels, it is convenient to assume that the number of channels N is a power of 2, i.e., $N=2^L$. The number of stages required for the demultiplexing of N channels will, therefore, be $\log_2 N = L$. Furthermore, we assume that all the channels have the same data rate or, equivalently, they occupy the same bandwidth. As we will see later, in spite of this assumption, the proposed system can be used in multirate applications.

The building block of the new demultiplexer is what we denote by the generic name splitter. Such splitters are illustrated in for example, U.S. Pat. No. 4,792,943, Gockler, Dec. 20, 1988, U.S. Pat. No. 4,839,889, Gockler, Jun. 13, 1989 and Digital TDM-FDM translator with multistage structure, IEEE Transactions on Communications, Vol. COM-26, No. 5, May 1978, pp. 734–741, Tsuda et al.

As seen in these references, a splitter is any device capable of splitting a baseband signal occupying a bandwidth W into two baseband signals each having a bandwidth of W/2. There are several different ways for implementing the splitter. For example, a splitter can be implemented using a lowpass and a bandpass filter each having a bandwidth of W/2, using a mixer and two identical lowpass filters, or using half-band filters. A multistage architecture discussed in the literature is the tree structured demultiplexer. Using the demultiplexed splitters, however, makes a system different from the tree structured demultiplexer. In the tree structured demultiplexer, the number of half-band filters in each stage is twice that of the preceding stage, while the bandwidth of each filter is one half that of those in the previous stage. On the other hand, in a system using time multiplexed splitters there is only one splitter in each stage. Furthermore, the splitters in all stages are the same, i.e., they are designed to split a signal with a bandwidth equal to the total bandwidth of all N signals into two signals each with half the total bandwidth.

In such a system, the splitter of the first stage has an input with bandwidth of W and two outputs each with bandwidth of W/2. These outputs are applied to the second stage and the second stage splits each of the inputs to form four signals each having bandwidth of W/4. In the same way, each stage doubles the number of input signals and reduces the bandwidth of each signal to one half. Finally stage L has $2^L$ signals at the output each with bandwidth of $W/2^L$.

The intuitive reasoning behind the present scheme is that: if a device can split a signal with bandwidth W into two signals each having a bandwidth of W/2, then it should be possible to use it in order to split two signals each with a bandwidth of W/2 into four signals each with a bandwidth of W/4, or to split four signals of W/4 bandwidth into eight signals each with a bandwidth of W/8, etc. The theoretical justification for the new scheme is based on two well-known theorems in digital signal processing, viz., the sampling theorem and the uncertainly or scale change theorem. The sampling theorem states that the number of samples per second required for the perfect reconstruction of a given signal is twice the bandwidth of the signal. In the example of multistage demultiplexer, according to the sampling theorem, the number of samples per unit of time required for each signal at the output of a given stage is half the number of samples required for the input signals of the same stage. In other words, the time interval between samples of each of the output signals is twice that of the time interval between the input samples. Compressing each output signal by reducing the time interval between the samples reduces the time duration of each output signal into one half and, therefore, according to scale change theorem, doubles its bandwidth.

According to the above discussion by proper interfacing of the splitters in different stages, we can conserve the bandwidth and the time frame. That is, the rate at which data is presented to each splitter and, therefore, the processing rate of the splitter, remains constant from stage to stage and is uniformly divided between different inputs. The procedure is equivalent to the time sharing of a high speed processor by several low speed applications.

In deriving the above structure, the splitter has been defined only in terms of the function it performs. That is, assumptions were not made about the way the splitter is implemented. Several options were mentioned earlier for the implementation of the splitter. Among those options, the most practical is sampling at twice the Nyquist rate and using half-band filters, Tsuda et al. Since the demultiplexer cell of the preferred embodiment essentially consists of a half-band filter, the terms "demultiplexer cell" and "half-band filter" are generally used synonymously throughout the present specification to describe one type of splitter. This simplifies the filter design due to the widening of the transition band. The fact that the even coefficients of the half-band filter are zero compensates for the doubling of the sampling rate. Half-band filters are characterized by a frequency response that is symmetric around $f_s/4$, where $f_s$ is the sampling frequency. At this point the magnitude is half the passband magnitude.

SUMMARY OF INVENTION

It is an object of the invention to provide an improved splitter structures for use in cellular group demultiplexers.

It is a more specific object of the invention to provide such improved splitter structures which use a smaller number of multipliers than conventional such splitters.

More specifically, a particular embodiment of the invention consists in a half-band filter requiring the minimum number of multipliers possible. Therefore, the latter is called the canonic form implementation.

In accordance with a particular embodiment of the invention there is provided a half-band filter for a cellular group demultiplexer having a top half and a bottom half;

each half having a filter section which receives an input $x(n)$;

where n is a discrete time index;

each half comprising a plurality of shift registers, each shift register providing a delay between the input thereof and the output thereof such that, if the input to the shift register is $x(n)$, the output is $x(n-1)$, and if the input is $x(n-3)$, then the output is $x(n-4)$, and so on;

each half further including a plurality of adder means and multiplier means;

said shift register, adder means and multiplier means being connected in circuit arrangement to produce outputs $y_1(n)$ and $y_2(n)$ such that (for odd m)

$$y_1[n] = h'_{2m-1}x[n] + h'_{2m-5}x[n-2] + \ldots + h'_5x[n-m+3] +$$

$$h'_1x[n-m+1] + h'_3x[n-m-1] + \ldots + h'_{2m-3}x[n-2m+2],$$

and $$y_2[n] = h'_{2m-3}x[n-1] + h'_{2m-7}x[n-3] + \ldots + h'_3x[n-m+2] +$$

$$h'_1x[n-m] + h'_5x[n-m-2] + \ldots + h'_{2m-1}x[n-2m+1].$$

and for even $m$, $$y_1[n] = h'_{2m-1}x[n] + h'_{2m-5}x[n-2] + \ldots + h'_3x[n-m+2] +$$

$$h'_1x[n-m] + h'_5x[n-m-2] + \ldots + h'_{2m-3}x[n-2m+2],$$

and $$y_2[n] = h'_{2m-3}x[n-1] + h'_{2m-7}x[n-3] + \ldots + h'_1x[n-m+1] +$$

$$h'_3x[n-m-1] + h'_7x[n-m-3] + \ldots + h'_{2m-1}x[n-2m+1].$$

where $$h'_i = (-1)^{\lfloor \frac{i+1}{4} \rfloor} \frac{h_i}{\sqrt{2}},$$

$h_i$=the coefficients of the half-band filter;

$$\lfloor \frac{i+1}{4} \rfloor$$

denotes the largest integer not exceeding $$\frac{i+1}{4};$$

wherein N=4m−1 is equal to the order of the filter; and m is an odd integer.

BRIEF DESCRIPTION OF DRAWINGS

The invention will be better understood by an examination of the following description, together with the accompanying drawings, in which:

FIGS. 2a to 2g illustrates graphically demultiplexing in stage 1 of a 4-channel FDMA group;

FIGS. 3a to 3g illustrates demultiplexing in stage 2 of channels 1 and 2 of the same FDMA group;

FIG. 4a to 4g illustrates demultiplexing in stage 2 of channels 3 and 4 of the same FDMA group;

FIG. 5 illustrates the functions performed by a splitter;

FIG. 10 illustrates one implementation of the input interface and buffer for the versatile splitter of FIG. 9;

FIG. 25 shows the canonic implementation of the upper section of the half-band filter of FIG. 21.

DESCRIPTION OF PREFERRED EMBODIMENTS

Figure 1:
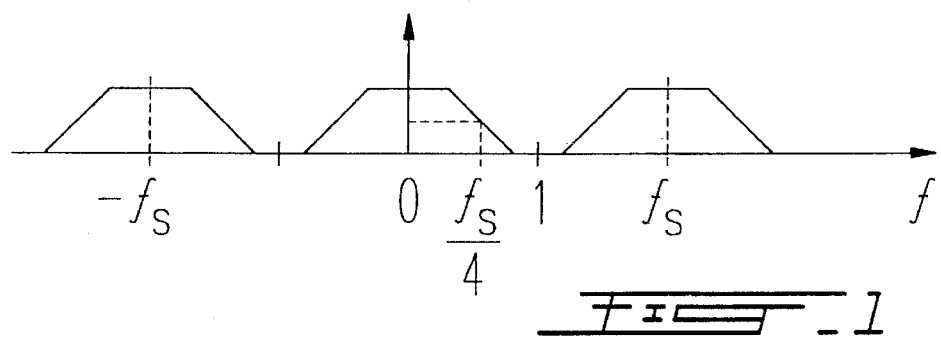
FIG. 1 shows the magnitude response of a lowpass prototype half-band filter used in the design of the splitter.

Referring to FIG. 1, the magnitude response of a lowpass prototype half-band filter used in the design of the splitter is illustrated therein. The half-band filter has a passband extending from $-f_s/8$ up to $f_s/8$ with a magnitude of 1. Performing inverse Fourier transform on $|H(e^{j2\pi f})|$, the coefficients $h(k)$ of the half-band filter of FIG. 1 can be evaluated as $$h(k) = \frac{2}{\pi^2 n^2} \left( \cos \frac{\pi k}{4} - \cos \frac{3\pi k}{4} \right).$$

For such a filter all even coefficients, except h(0), are zero. This property reduces the number of operations by half and, therefore, compensates for the oversampling.

A design procedure for determining the values of the coefficients is given in Multirate Digital Signal Processing, Crochiere et al, pp. 155–235.

As an illustrative example, let's consider a 4-channel FDMA group as shown in FIGS. 2b to 2d and 2e to 2g. The sampling frequency at the input of the first stage is $f^1_s = 8B$, where B is the bandwidth of each channel. The splitter of the first stage performs two functions as shown in two dashed boxes of FIG. 2. In the first dashed box, the FDMA signal is first shifted to the left by $f^1_s/8$ and then filtered using a half-band filter as shown in FIG. 2b. The filtered signal after decimation by two is shown in FIG. 2c. At this point channels 1 and 2 are separated from channels 3 and 4. This signal is shifted to the right by $f^1_s/8$ as shown in FIG. 2d to be used by the splitter of stage 2. The second function, needed for extracting channels 3 and 4, is the same as the first function. The only difference is that the amount of the left shift is $3f^1_s/8$ instead of $f^1_s/8$ for the first function. The steps of the second function of the splitter are illustrated in FIGS. 2e–2g.

In the second stage there are two inputs which are outputs of the first stage. These signals are shown in FIGS. 3a and 4a. The sampling frequency and bandwidth of these signals are half that of the input of stage 1. Two functions of the splitter performed on these signals are illustrated in FIGS. 3 and 4. Comparing these two Figures we note that the functions performed on the inputs of stage 2 are exactly the same. The only difference between these two Figures and FIG. 2 is that, here, the bandwidth of the signals and, therefore, the sampling frequency is reduced to one-half. Therefore, each of these two functions takes one-half the time of stage 1 operation. As a result, in stage 2, the same splitter can be time multiplexed. From the implementation point of view, the only difference between stages 1 and 2 is the extra buffer required for stage 2 to store the data of FIG. 4 when the splitter works on the data of FIG. 3 and vice-versa.

In general, for a demultiplexer with $N=2^L$ channels, the required storage doubles at each stage compared to the previous stage. Therefore, if K storage elements are used in the first stage, the number of storage elements in the stage L will be $2^{L-1}K$.

As discussed above, the main building block of the demultiplexer is the splitter which performs the functions shown in FIG. 5. Let X(z) be the z-transform of the sampled FDMA signal. The z-transforms A(z) and B(z) of the splitted outputs, before decimation and right shift are expressed as $$A(z) = H(z)X(z')|_{z'=exp(j2\pi \frac{(f_s/8)}{f_s})z} \quad (1)$$

and $$B(z) = H(z)X(z')|_{z'=exp(j2\pi \frac{(3f_s/8)}{f_s})z} \quad (2)$$

where H(z) is the z-transform of the baseband prototype filter of FIG. 1. H(z) in non-causal form, can be written as, $$H(z) = Z^{-2m}\left[ h(0) + \sum_{i=1}^{m} h(2i-1)(Z^{2i-1} + Z^{-2i+1}) \right], \quad (3)$$

where N=4m−1 is the number of coefficients of the half-band filter and m is an integer. X(z) can be written as, $$X(z) = X_6(z^2) + z^{-1} X_o(z^2) \quad (4)$$

where $X_6(z^2)$ and $X_o(z^2)$ are the z-transforms of the time-series consisting of the even and odd samples of the input. That is, $X_6(z^2)$ and $X_o(z^2)$ represent the input after a decimation by two. Similarly, A(z) and B(z) can be decomposed into their respective decimated versions, i.e., $$A(z) = A_e(z^2) + z^{-1} A_o(z^2) \quad (5)$$

and $$B(z) = B_e(z^2) + z^{-1} B_o(z^2) \quad (6)$$

Substituting Eqs. (3) and (4) in Eqs. (1) and (2), $$A_e(z^2) = z^{-2m} X_e(jz^2) h(0) + \quad (7)$$

$$\frac{\sqrt{2}}{2} (1-j) z^{-2m-1} X_o(jz^2) \sum_{i=1}^{m} h(2i-1)(z^{2i-1} + z^{-2i+1}),$$

$$B_e(z^2) = z^{-2m} X_e(-jz^2) h(0) - \quad (8)$$

$$\frac{\sqrt{2}}{2} (1+j) z^{-2m-1} X_o(-jz^2) \sum_{i=1}^{m} h(2i-1)(z^{2i-1} + z^{-2i+1}),$$

$$A_o(z^2) = z^{-2m+1} X_e(jz^2) \sum_{i=1}^{m} h(2i-1)(z^{2i-1} + z^{-2i+1}) + \quad (9)$$

$$\frac{\sqrt{2}}{2} (1-j) z^{-2m} X_o(jz^2) h(0),$$

and $$B_o(z^2) = z^{-2m+1} X_e(-jz^2) \sum_{i=1}^{m} h(2i-1)(z^{2i-1} + z^{-2i+1}) - \quad (10)$$

$$\frac{\sqrt{2}}{2} (1+j) z^{-2m} X_o(-jz^2) h(0),$$

Shifting the outputs to the right by $f^i_s/8$, we have, $$A_e(-jz^2) = j^m z^{-2m} X_e(z^2) h(0) + \quad (11)$$

$$j^m \frac{\sqrt{2}}{2} (1-j) X_o(z^2) \sum_{i=1}^{m} h(2i-1)(j^{-i+1} z^{-2m+2i-2} + j^i z^{-2m-2i}),$$

$$B_e(-jz^2) = j^m z^{-2m} X_e(-z^2) h(0) - \quad (12)$$

$$j^m \frac{\sqrt{2}}{2} (1+j) X_o(-z^2) \sum_{i=1}^{m} h(2i-1)(j^{-i+1} z^{-2m+2i-2} + j^i z^{-2m-2i}),$$

$$A_o(-jz^2) = j^m X_e(z^2) \sum_{i=1}^{m} h(2i-1)(j^{-i} z^{-2m+2i} + j^{i-1} z^{-2m-2i+2}) + \quad (13)$$

$$j^m \frac{\sqrt{2}}{2} (1-j) z^{-2m} X_o(z^2) h(0),$$

and $$B_o(-jz^2) = j^m X_e(-z^2) \sum_{i=1}^{m} h(2i-1)(j^{-i} z^{-2m+2i} + j^{i-1} z^{-2m-2i+2}) - \quad (14)$$

$$j^m \frac{\sqrt{2}}{2} (1+j) z^{-2m} X_o(-z^2) h(0),$$

Since the bandwidth of the output of the splitter is half that of the input, we only need to generate either even or odd output samples. Therefore, either we use Eqs. (11) and (12) or Eqs. (13) and (14). The choice will be made based on the complexity of the resulting structure. To compare the structures, we consider the example of a half-band filter with coefficients (N=7 and m=2). Then Eqs. (11), (12), (13) and (14) are, $$A_e(-jz^2) = -z^{-4} X_e(z^2) h(0) - \quad (15)$$

$$\frac{\sqrt{2}}{2} (1-j) X_o(z^2)[(h(1)z^{-4} - h(3)z^{-8}) + j(h(1)z^{-6} - h(3)z^{-2})],$$

$$B_e(-jz^2) = -z^{-4} X_e(-z^2) h(0) + \quad (16)$$

$$\frac{\sqrt{2}}{2} (1+j) X_o(-z^2)[(h(1)z^{-4} - h(3)z^{-8}) + j(h(1)z^{-6} - h(3)z^{-2})],$$

$$A_o(-jz^2) = -X_e(z^2)[(h(1)z^{-4} - h(3)) + j(-h(1)z^{-2} + \quad (17)$$

$$h(3)z^{-6})] - \frac{\sqrt{2}}{2} (1-j) z^{-4} X_o(z^2) h(0),$$

$$B_o(-jz^2) = -X_e(-z^2)[(h(1)z^{-4} - h(3)) + j(-h(1)z^{-2} + \quad (18)$$

$$h(3)z^{-6})] + \frac{\sqrt{2}}{2} (1+j) z^{-4} X_o(-z^2) h(0).$$

Figure 6:
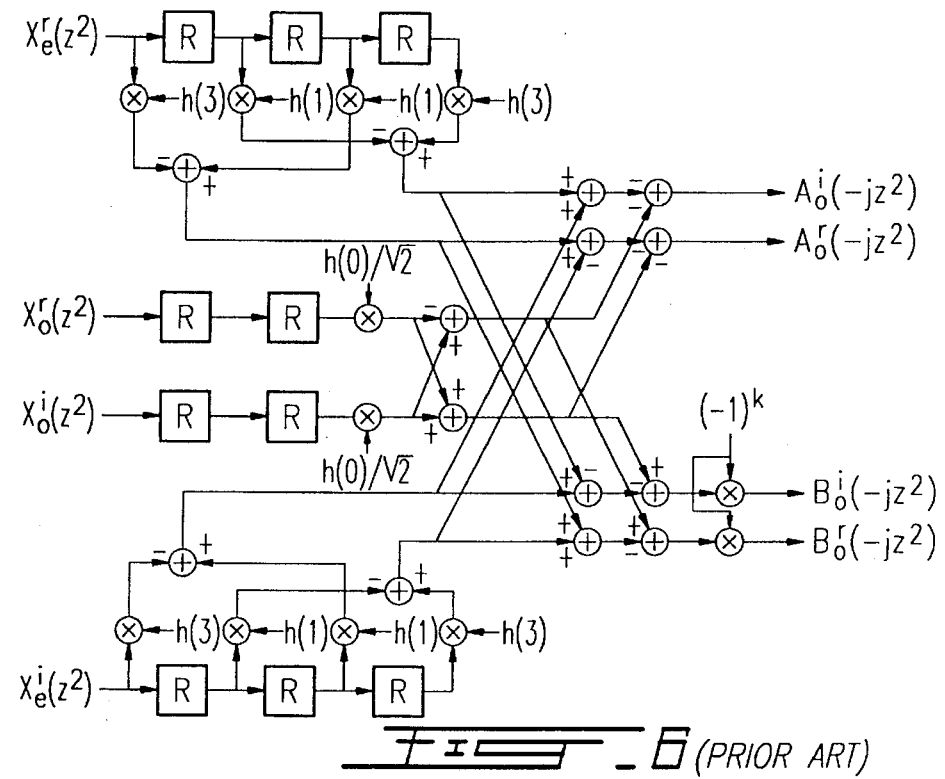
FIG. 6 illustrates a conventional splitter or cell structure.

Turning now to FIG. 6, a conventional cell structure illustrated in FIG. 6 includes a plurality of parallel-in/parallel-out registers R. The structure also includes multipliers and adders which are represented by symbols as well known in the art.

The input to the splitter is divided into real and imaginary parts of odd and even samples. The input data is shifted into the splitter at each clock period and is shifted through parallel register blocks at each clock period. The clock frequency for shifting on both odd and even branches is equal to the sampling frequency at the output of the splitter. Outputs of register blocks are multiplied by proper coefficients and passed through a set of adders. For channel B, an additional block alternately inverts the sign of the samples. In this block, k is the time index of channel B.

Figure 7:
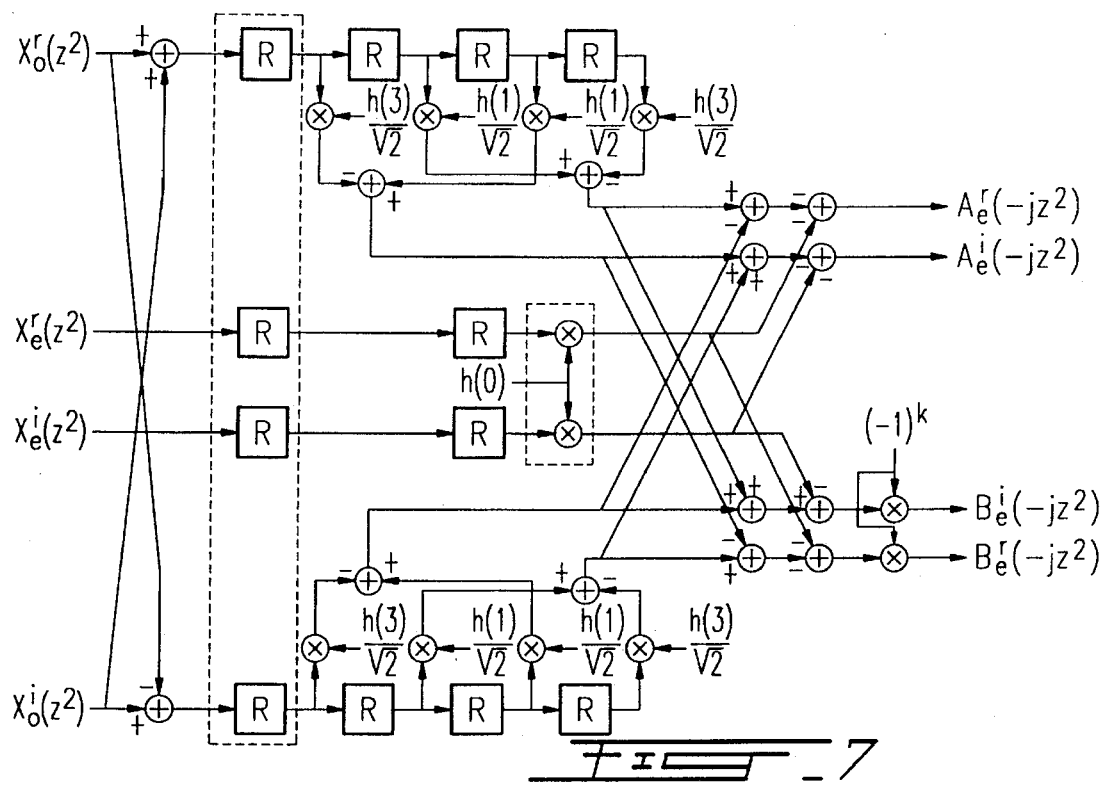
FIG. 7 illustrates one embodiment of a new splitter or cell structure in accordance with the invention.

An improved splitter is illustrated in FIG. 7.

Since further improvements are disclosed in this application, we denote this improved cell type as a type "A" improved splitter. Further improvements will be denoted by the type "B" and "C" improved splitters. Type "A" represents a modest improvement. Type "B" represents a significant improvement and type "C" is the ultimate improvement in the sense that it requires the least number of multipliers possible.

Looking at FIGS. 6 and 7, one may conclude that these two structures have the same number of multipliers and adders and that the new structure has two extra blocks of R registers. However, a more careful examination of FIG. 7 reveals that the complexity of the new cell can be reduced, making it more attractive compared to the conventional cell. This simplification is achieved in two ways. First, four register blocks inside the dashed box can be removed since they have no effect on the performance of the splitter. The only effect of the removal of these registers is to change the order of sign changes of the samples of the channel B, i.e., changing k to k+1.

Second, in order for the cell to have a unity gain, the value of the h(0) should be equal to ½. Hence, the multipliers in the dashed box of FIG. 7 can be removed. In fact, multiplication by ½ in binary is a 1-bit right shift which can be accomplished by proper wiring. Removal of these two multipliers makes the new structure much more attractive compared to the conventional cell. It is also possible to upscale the coefficients of the conventional structure and remove two multipliers. However, this will increase the gain of the cell. A gain of more than 1 for the splitter cell will cause overflow especially when the number of stages of the demultiplexer is high. Therefore, in the conventional cell structure we cannot remove any multiplier because of the required unity gain for the cell.

In summary, the new type "A" cell has two less multipliers and two less register blocks. In the generalized splitter cell, to be discussed later, each register block is not just one parallel-in/parallel-out register (8 up to 16 bit width). For example, for a 16 channel demultiplexer, one register block contains 8 parallel-in/parallel-out registers connected in a shift register configuration. If we consider having an 8-bit data path, each register block has to store 64 bits. Therefore, even having two less register blocks translates into a considerable saving in hardware.

Figure 8:
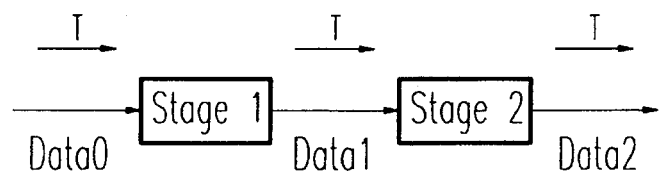
FIG. 8 illustrates a 4-channel cellular demultiplexer showing data inputs and outputs.

A versatile splitter cell is described in association with FIGS. 8, 9, 10, 11 and 12. The versatile splitter consists of the new splitter cell structure of FIG. 7 or any of further improved cells to be described later in this application, i.e., type "B" and "C" cells and some additional Input/Output data shuffling. By versatile splitter we mean a splitter which has $2^{i-1}$ channels at its input, where i=1,2, . . . , L is the stage number. This splitter divides the bandwidth of each input channel by two and outputs $2^i$ channels of equal bandwidth. A 4-channel demultiplexer is shown in FIG. 8. This demultiplexer consists of two stages and each stage is a versatile splitter. The splitter of stage one receives the data $\{C_0^0(k)\}$, k=0, 1, 2, . . . sample by sample. The output of stage one contains two sets of data $\{C_0^1(k)\}$ and $\{C_1^1(k)\}$ where both have a bandwidth equal to half the bandwidth of $\{C_0^0(k)\}$. The splitter of the second stage splits each of its inputs into two equal bandwidth data streams and, therefore, four channels denoted by $\{C_0^2(k)\}$, $\{C_1^2(k)\}$, $\{C_2^2(k)\}$, and $\{C_3^2(k)\}$ are present at the output of stage 2. By $C_s^i(k)$ we mean kth sample of channel s at the output of stage 1.

From FIG. 8, we note that in the versatile splitters data need to enter into and exit from each splitter sample by sample in a specific order. Therefore, some data shuffling is required at the input and output of the splitter.

Figure 9:
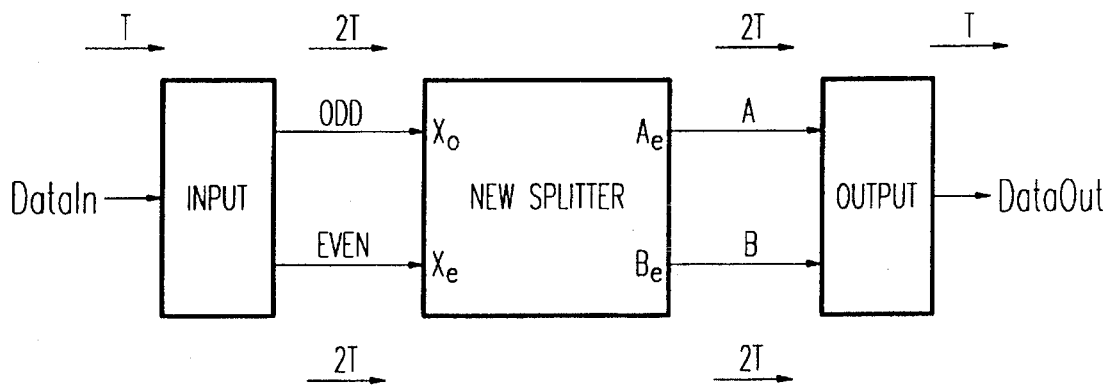
FIG. 9 illustrates in block diagram form a versatile splitter.

Input and Output blocks in FIG. 9 perform the necessary data shuffling.

To explain the function of these blocks, we consider the second stage (i=2) of a demultiplexer. The order of data is as follows:

DataIn = Data1 = . . . , $C_1^1(3), C_0^1(3), C_1^1(2), C_0^1(2), C_1^1(1),$ $C_0^1(1), C_1^1(0), C_0^1(0)$ Odd = . . . , $C_1^1(3), C_0^1(3), C_1^1(1), C_0^1(1)$ Even = . . . , $C_1^1(2), C_0^1(2), C_1^1(0), C_0^1(0)$

A = . . . , $C_2^2(1), C_0^2(1), C_2^2(0), C_0^2(0)$

B = . . . , $C_3^2(1), C_1^2(1), C_3^2(0), C_1^2(0)$

Figure 12:
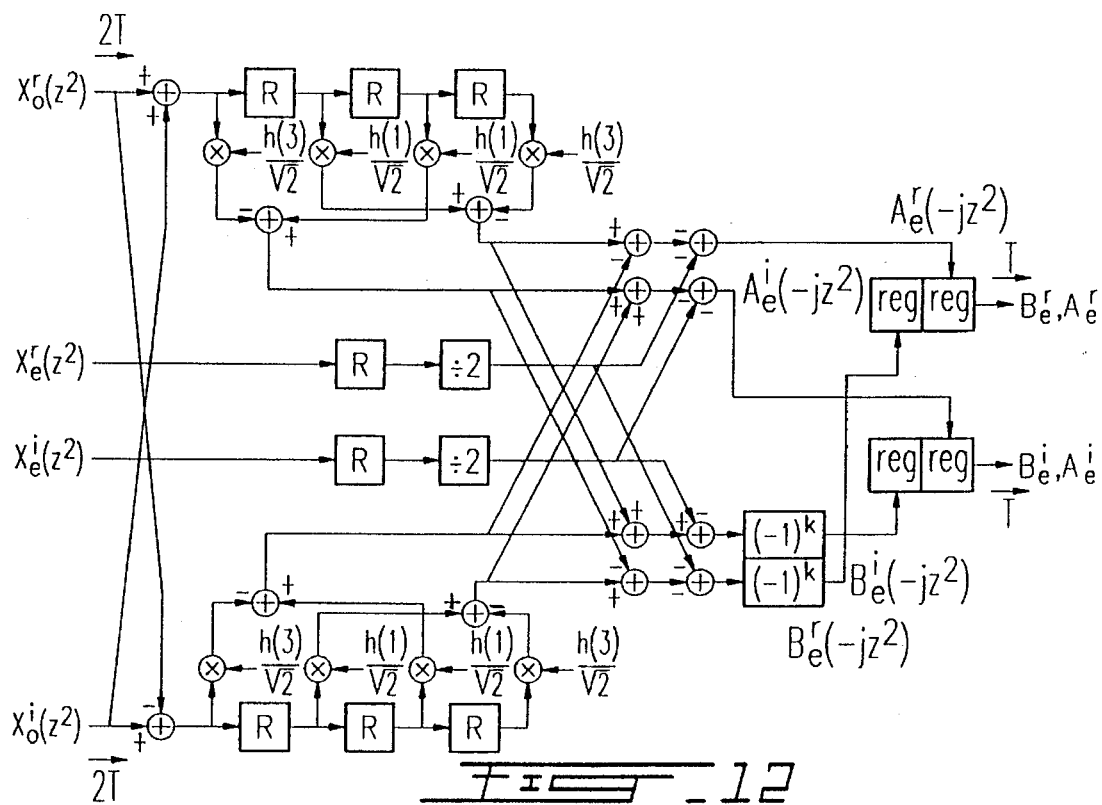
FIG. 12 is a block diagram of the versatile splitter including an output interfaces.

DataOut = Data2 = . . . , $C_3^2(1), C_2^2(1), C_1^2(1), C_0^2(1), C_3^2(0),$ $C_2^2(0), C_1^2(0), C_0^2(0)$ Based on the above, the function of the output interface is to alternately take samples from A and B outputs of the splitter and to make them available at the output of the stage. The output interface can be easily implemented. In FIG. 12, the new splitter of FIG. 8 is combined with the output interface circuitry. The number of parallel-in/parallel-out registers of each R block in the splitter is $2^{i-1}$.

The input interface block separates even and odd samples of all the channels at the input of the stage 1 and presents them at even and odd inputs of the splitter. Since there are $2^{i-1}$ channels available at the input of stage 1, the input interface should send alternately $2^{i-1}$ samples to even branch and $2^{i-1}$ samples to odd branch. Moreover, the data is continuously being transmitted and cannot be stopped or delayed. This requires a buffer to store the incoming data while the splitter is working on the previously received data. Two possible implementations of the input block of the versatile splitter which also contains the required buffers is shown in FIGS. 10 and 11.

The input interface block has eight R blocks. Each R block, contains $2^{i-1}$ parallel-in/parallel-out shift registers where i is the stage number. A possible implementation of the input interface block is shown in FIG. 10. The incoming data enters the interface block sample by sample. Real and imaginary parts of the input samples are shifted through the R blocks each T seconds. The R blocks are filled from top to bottom for both real and imaginary parts. Odd and even samples are taken from those R blocks which are already filled up. The input interface block makes the odd and even samples of each channel available to the splitter at the same time.

Figure 11:
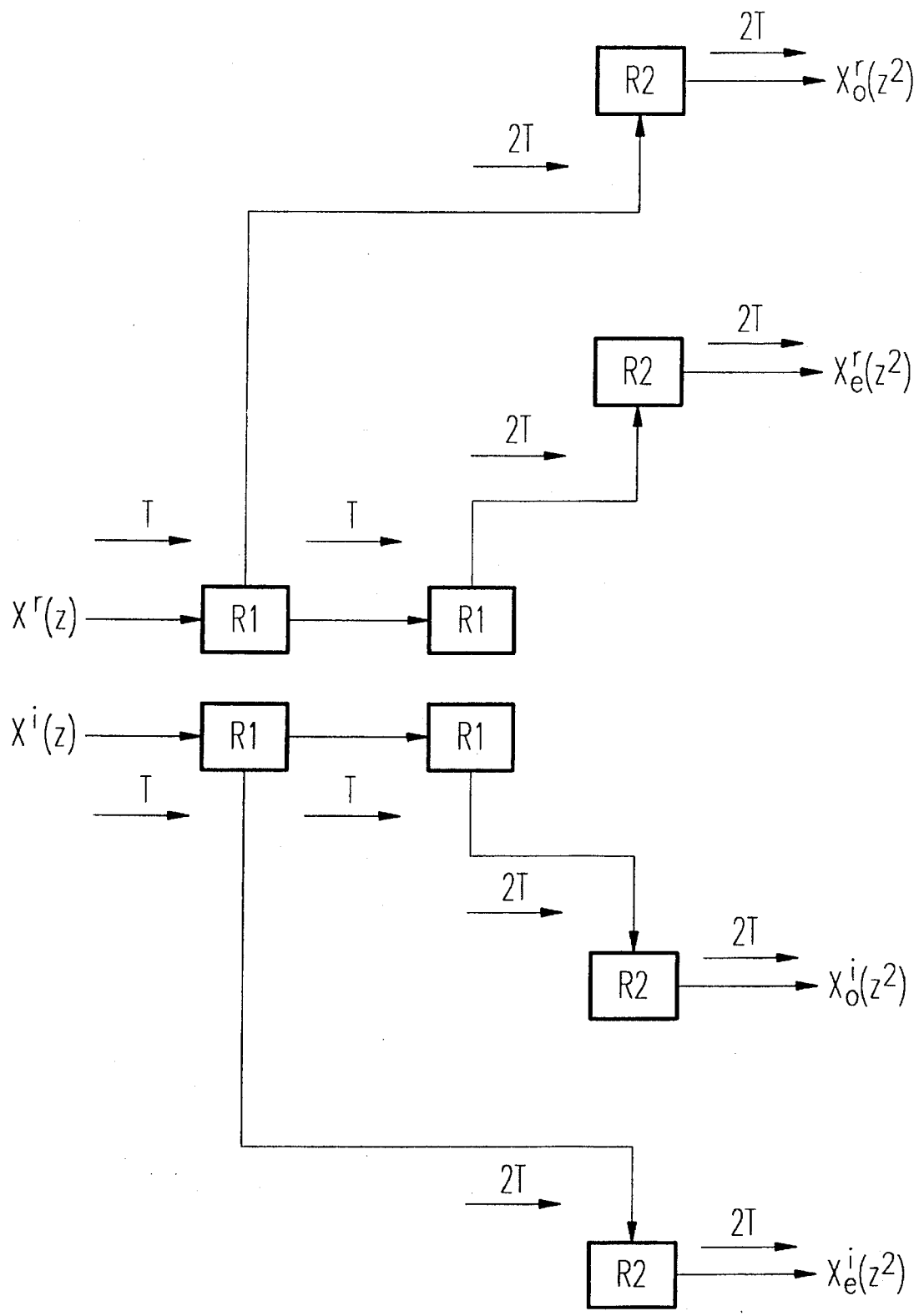
FIG. 11 illustrates another implementation of the input interface and buffer for the versatile splitter.

Another implementation for the input interface block is shown in FIG. 11. In FIG. 10B, the input enters with sampling frequency $f_s=1/T$ is shifted in $R_1$ registers. When $R_1$ registers are filled up, their contents are loaded into $R_2$ registers and shifted out with frequency $f_s$. While the data is being shifted into $R_1$ registers, the input is shifted into $R_1$ registers continuously. The $R_1$ and $R_2$ registers are $2^{i-1}$, m-bit parallel-in-parallel-out registers, where m is the length of the data path.

Figure 13:
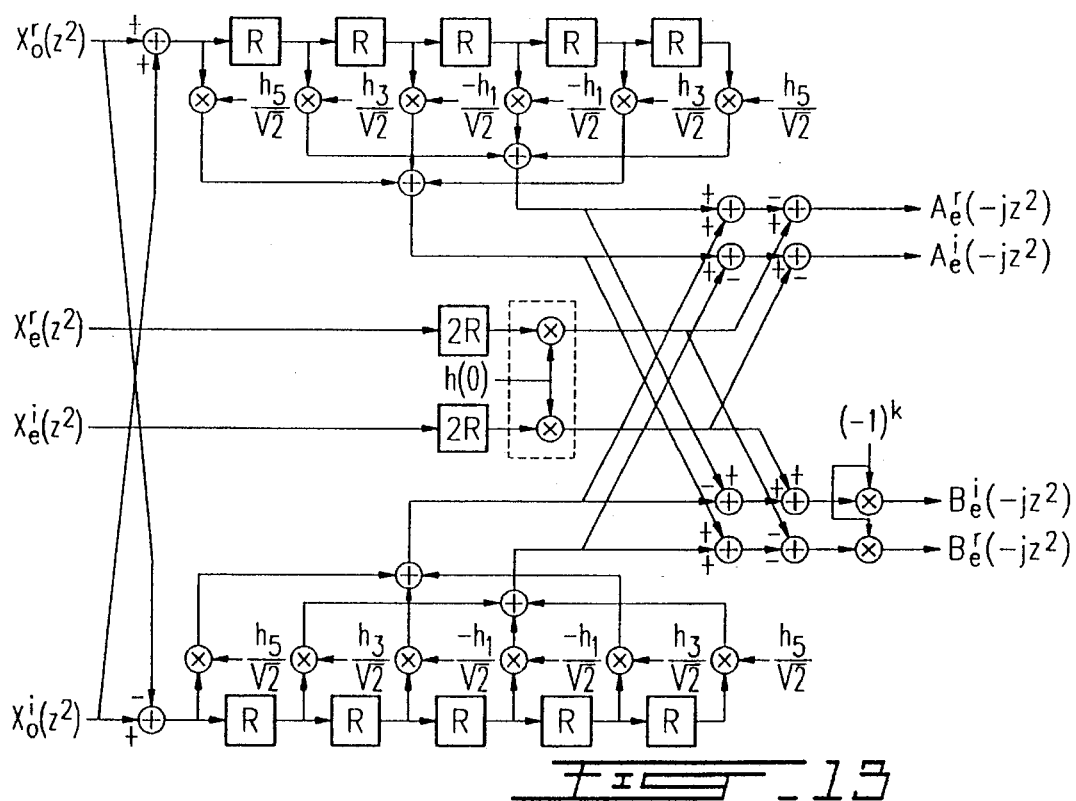
FIG. 13 is a half-band filter for cellular demultiplexer N=11.

FIG. 13 shows a type "A" splitter, similar to that of FIG. 7, however, for N=11. For a half-band filter, all even coefficients, except $h_0$, are equal to zero. Moreover, for the structure of FIG. 13, $h_0=\frac{1}{2}$ permitting us to save an extra two multiplications.

The order of half-band filters used for group demultiplexing is in the form of N=4m−1, where m is an integer. For example, values m=1, 2, 3, 4 and 5 result in half-band filters of orders n=3, 7, 11, 15 and 19, respectively. With the structure of FIG. 12 the total number of multipliers is N+1=4m. Now, we introduce a technique which reduces the number of multipliers by m for even values of m and by m+1 for odd values of m. For example, for the case of N=11 the number of multipliers using the scheme of FIG. 13 is 12. We will show that, with the modification suggested here, the number of multipliers will be reduced to 8. We call this improvement type "B" improvement.

Figure 14:
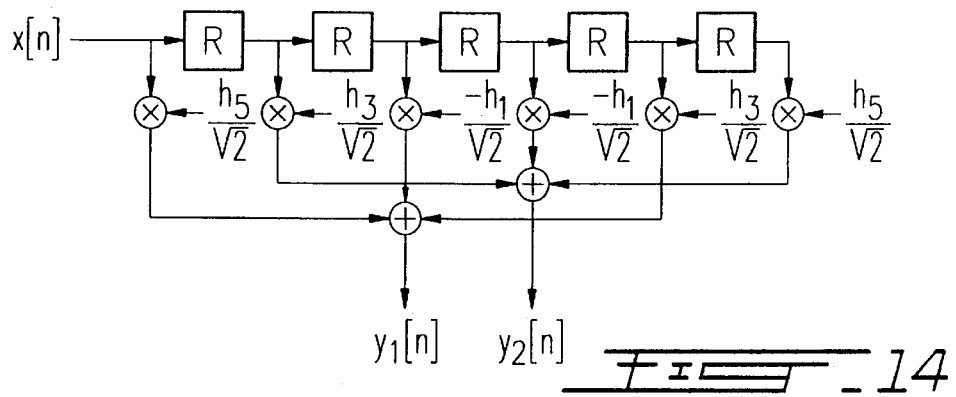
FIG. 14 shows the upper filter of FIG. 13 before modification.

Due to the symmetry of the upper and lower filter sections, we can demonstrate the suggested modification for the upper half of the filter of FIG. 13 and duplicate the results for the lower half. Also, for the sake of clarity, we confine our discussion to the case of N=11. Generalization to any other value of N is straightforward. FIG. 14 shows the filter on the upper half of FIG. 13. The input of this section is denoted by x[n] and the outputs of the adders by $y_1[n]$ and $y_2[n]$.

$y_1[n]$ and $y_2[n]$ can be written as follows:

$$y_1[n] = \frac{1}{\sqrt{2}} \{h_5 x[n] - h_1 x[n-2] + h_3 x[n-4]\}, \quad (19)$$

where n=time index and $$y_2[n] = \frac{1}{\sqrt{2}} \{h_3 x[n-1] - h_1 x[n-3] + h_5 x[n-5]\}, \quad (20)$$

Substituting n−1 for n in (19), we get, $$y_1[n-1] = \frac{1}{\sqrt{2}} \{h_5 x[n-1] - h_1 x[n-3] + h_3 x[n-5]\}. \quad (21)$$

Subtracting (21) from (20) results in, $$y_2[n] = y_1[n-1] + \frac{1}{\sqrt{2}} (h_3 - h_5)\{x[n-1] - x[n-5]\}. \quad (22)$$

Figure 15:
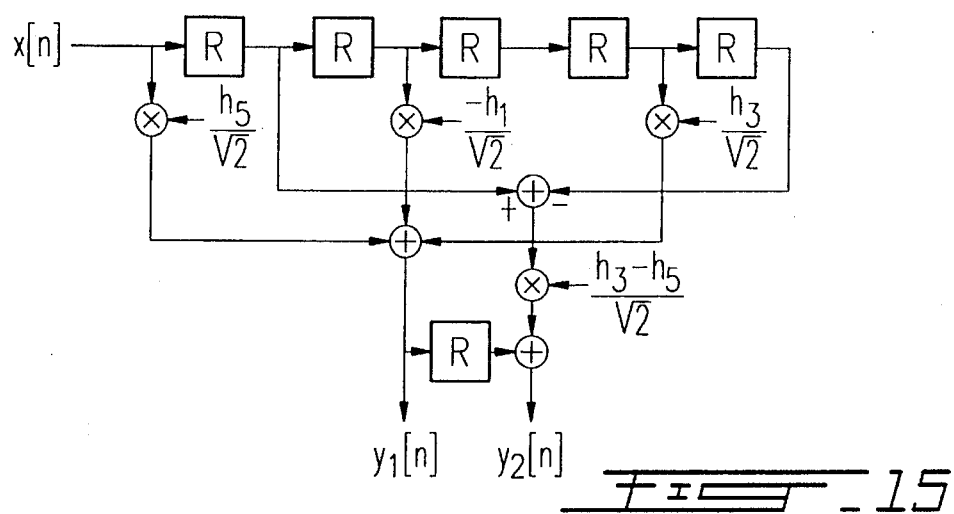
FIG. 15 shows the upper filter of FIG. 13 after being modified in accordance with equation (22)

The implementation based on (19) and (22) is shown in FIG. 15. It is seen that the number of multipliers for this section is reduced from 6 to 4. Therefore, the saving in the number of multipliers for the complete cell is 8 which is 4 multipliers less than those required by the original cell. One disadvantage of this implementation is an extra register block in each filter section. This extra register block can be avoided as follows. Instead of substituting n−1 for n in (19), substitute n by n+1 in (20) to get, $$y_2[n+1] = \frac{1}{\sqrt{2}} \{h_3 x[n] - h_1 x[n-2] + h_5 x[n-4]\}. \tag{23}$$

Subtracting (19) from (23) we get, $$y_2[n+1] = y_1[n] + \frac{1}{\sqrt{2}} (h_3 - h_5)\{x[n] - x[n-4]\}. \tag{24}$$

Figure 16:
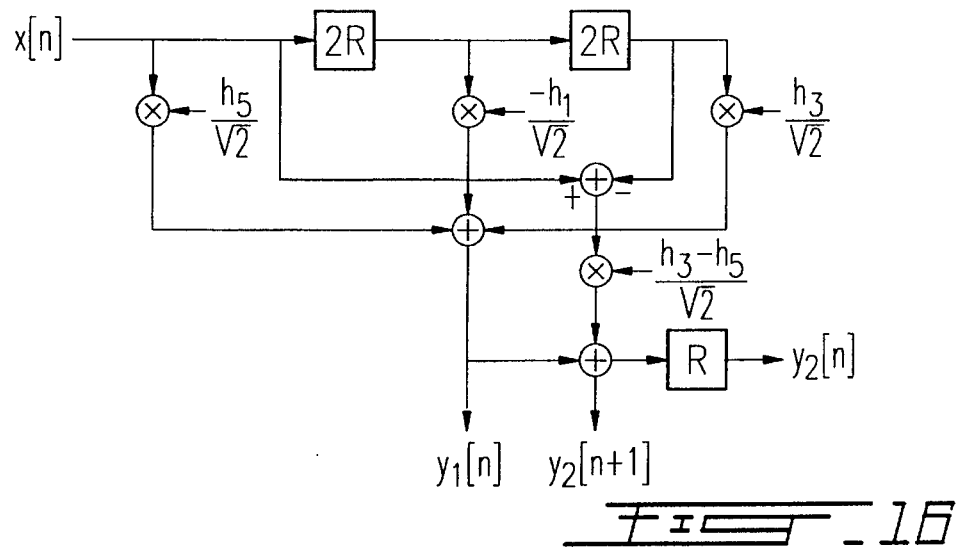
FIG. 16 shows the upper filter of FIG. 1 modified in accordance with equations (33) and (24)
Figure 17:
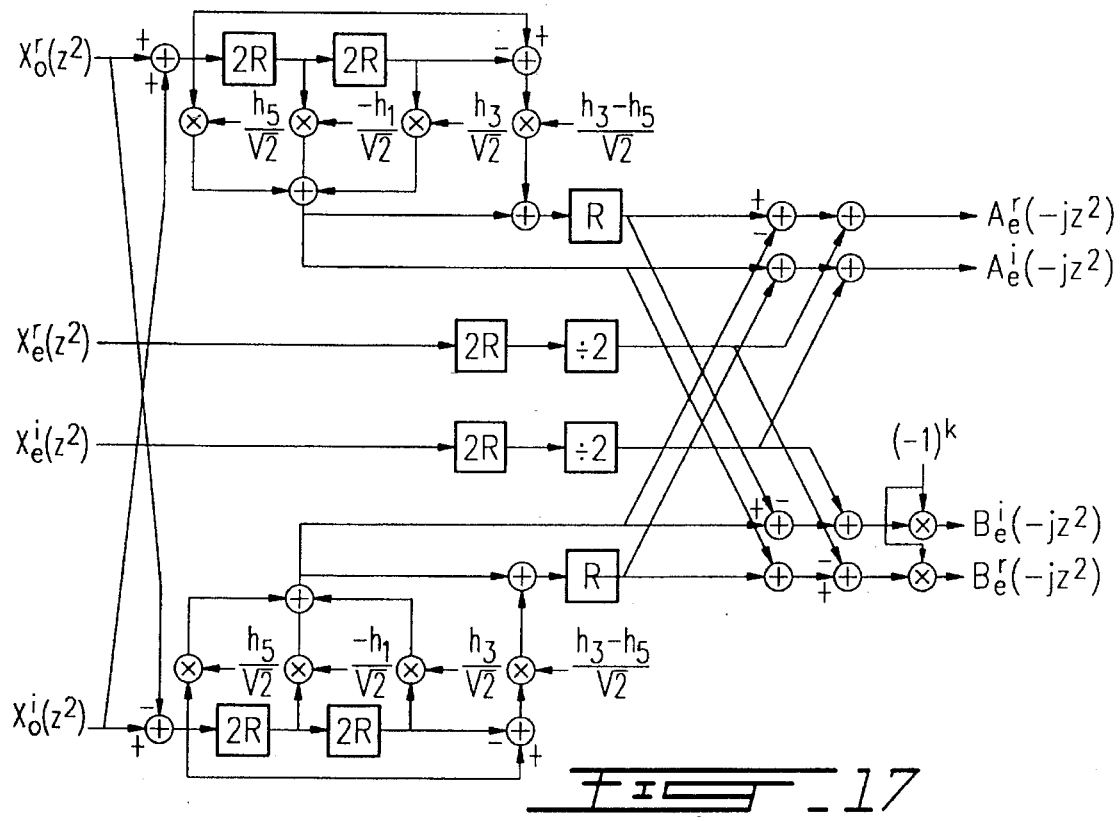
FIG. 17 shows the cell or splitter of FIG. 13 modified in accordance with FIG. 16.

An implementation based on (19) and (24) is shown in FIG. 16 for the upper section. FIG. 17 shows the overall demultiplexer cell modified using the above-mentioned "B" type improvement. It is seen that the number of multipliers is reduced by 4 without increasing the register size.

At this point, we explain the type "C" improvement called canonic form implementation- For the sake of clarity, first, we explain the case of N=11. Then, we generalize to the case of arbitrary N. Combining (19) and (23) we get, $$z_1[n] = \frac{y_2[n+1] + y_1[n]}{2} = \tag{25}$$

$$\frac{1}{2\sqrt{2}} (h_3 + h_5)\{x[n] + x[n-4]\} - \frac{h_1}{\sqrt{2}} x[n-2],$$

and $$z_2[n] = \frac{y_2[n+1] - y_1[n]}{2} = \frac{1}{2\sqrt{2}} (h_3 - h_5)\{x[n] - x[n-4]\}. \tag{26}$$

Instead of computing $y_1[n]$ and $y_2[n]$ using (19) and (20), we can find $z_1[n]$ and $z_2[n]$ using (25) and (26) and then find $y_1[n]$ and $y_1[n+1]$ using:

$$y_1[n] = z_1[n] - z_2[n], \tag{27}$$

and $$y_2[n+1] = z_1[n] + z_2[n]. \tag{28}$$

Figure 18:
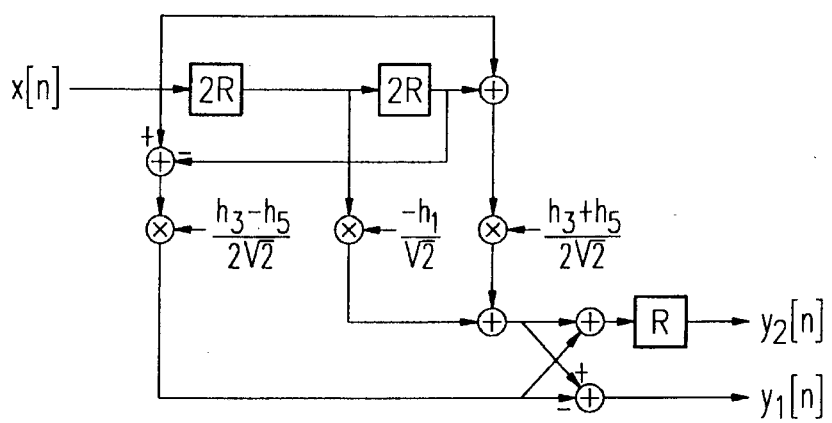
FIG. 18 illustrates the canonic form implementation of the upper filter of FIG. 13, i.e., for N=11.
Figure 19:
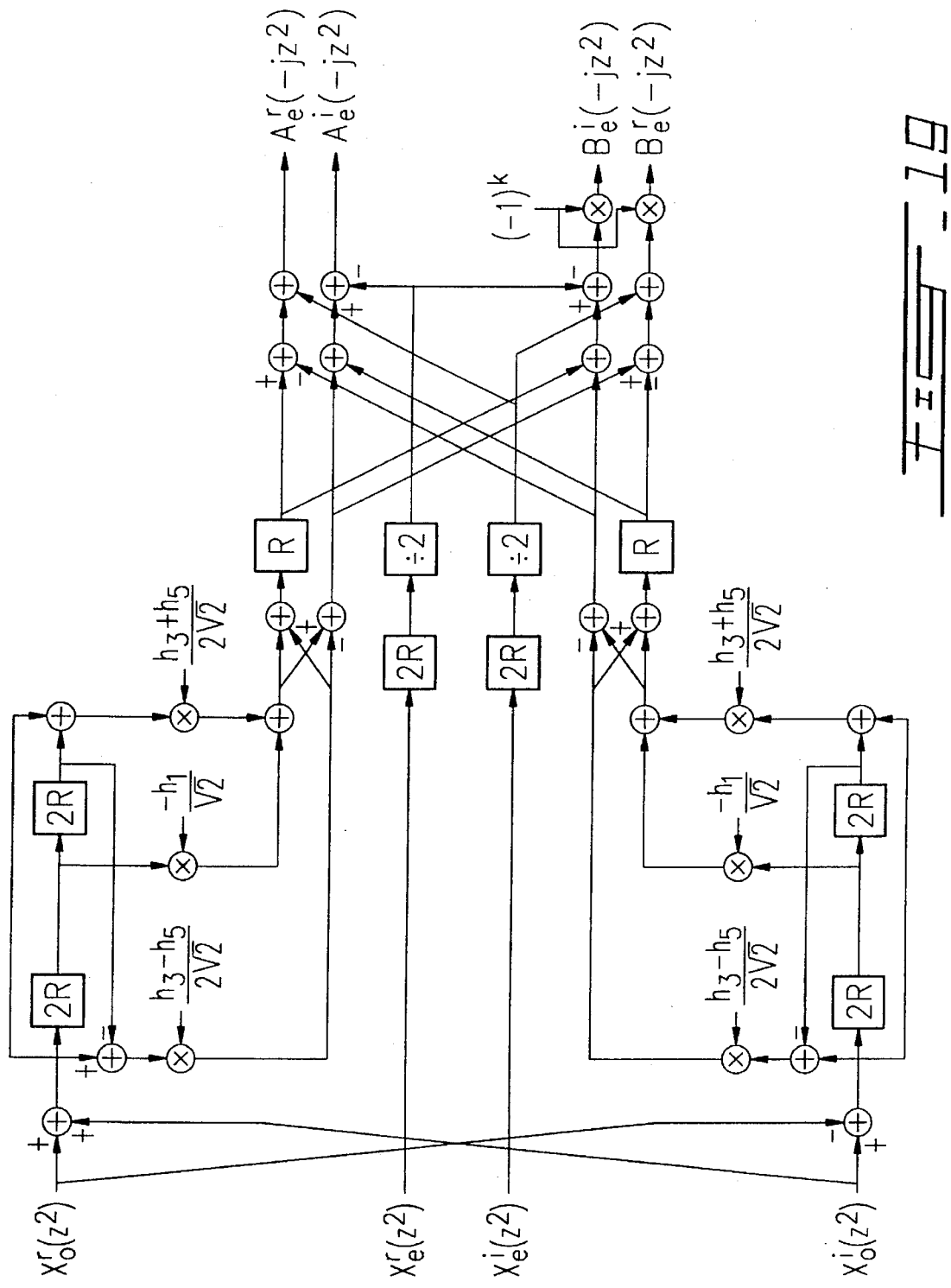
FIG. 19 illustrates the splitter of FIG. 13 modified in accordance with FIG. 18.

An implementation of the upper filter based on this technique is shown in FIG. 18. FIG. 19 shows the overall demultiplexer cell modified according to canonic form. It is seen that this implementation saves 6 multipliers without increasing the register size. Moreover, since in this implementation (and also that of FIG. 17) only the output of second and fourth registers are used four registers can be combined into two longer registers denoted by 2R. This reduces the number of connections and, therefore, simplifies the implementation.

Figure 20:
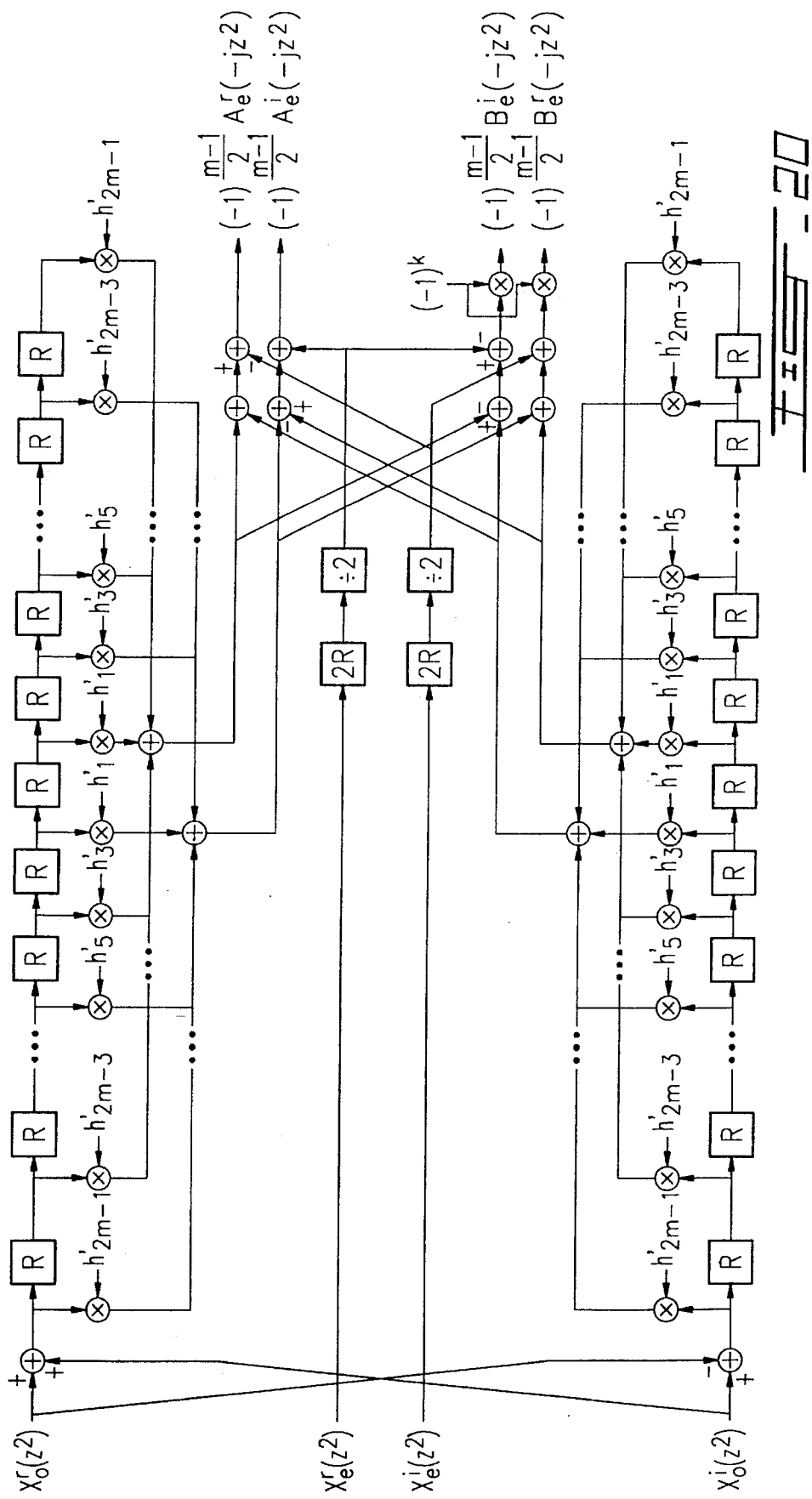
FIGS. 20 and 21 show the general form of a splitter with arbitrary values of N=4m−1 with odd values of m (FIG. 20) and even values of m (FIG. 21), respectively.

In the above method of deriving the canonic form of splitters used for a cellular group demultiplexer, the derivation of the canonic form was explained using a filter of order N=11 as an example. The following discussion expands the derivation to the case of filters of arbitrary value, specifically, the case where N=4m−1. FIG. 20 corresponds to the case where the values of m are odd, and FIG. 21 corresponds to the case where the values of m are even. In order to simplify the presentation, we have introduced the following change of variable:

$$h'_i = (-1)^{\lfloor \frac{i+1}{4} \rfloor} \frac{h_i}{\sqrt{2}}, \tag{29}$$

where, $\lfloor x \rfloor$ denotes the largest integer not exceeding x.

Figure 21:
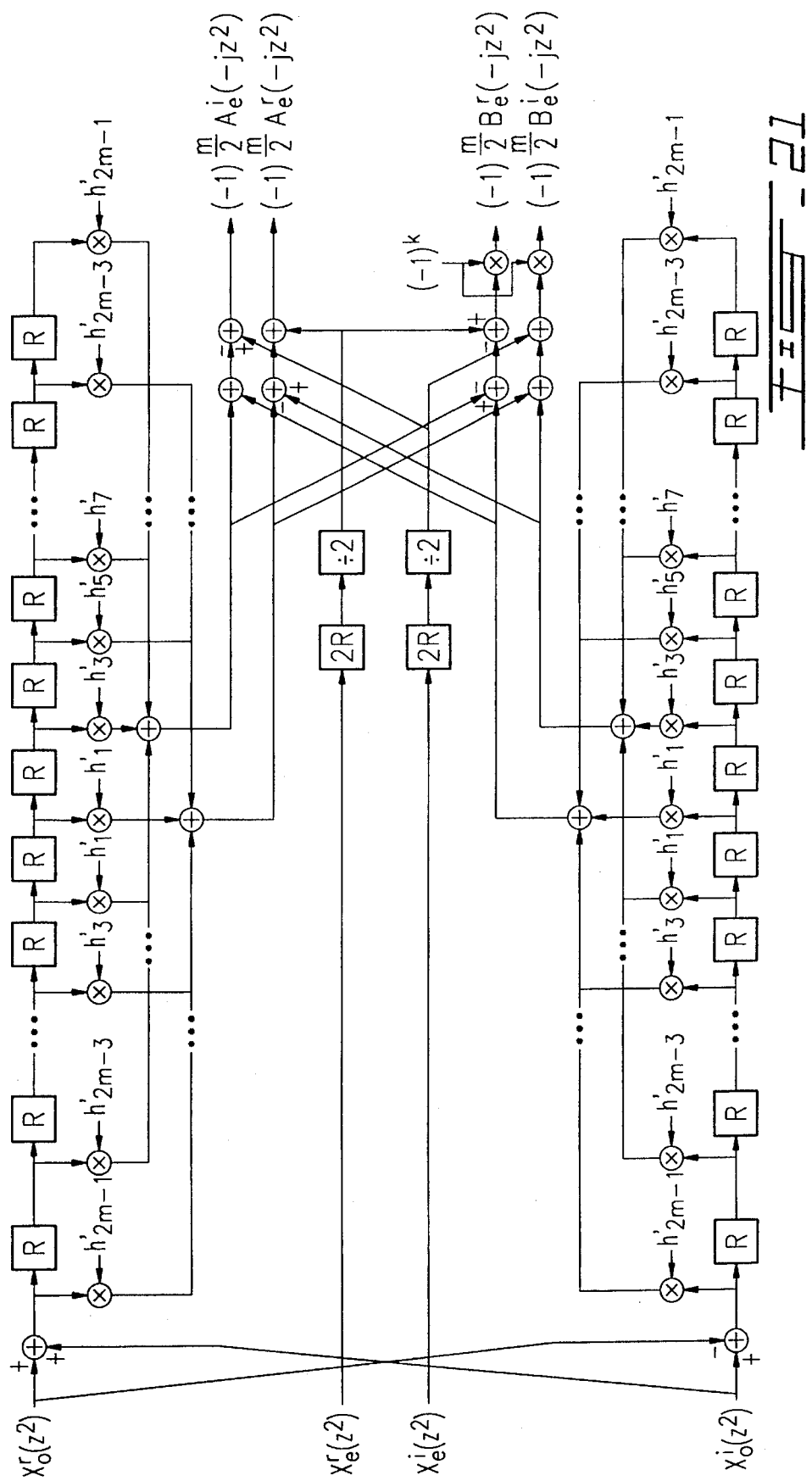
Figure 22:
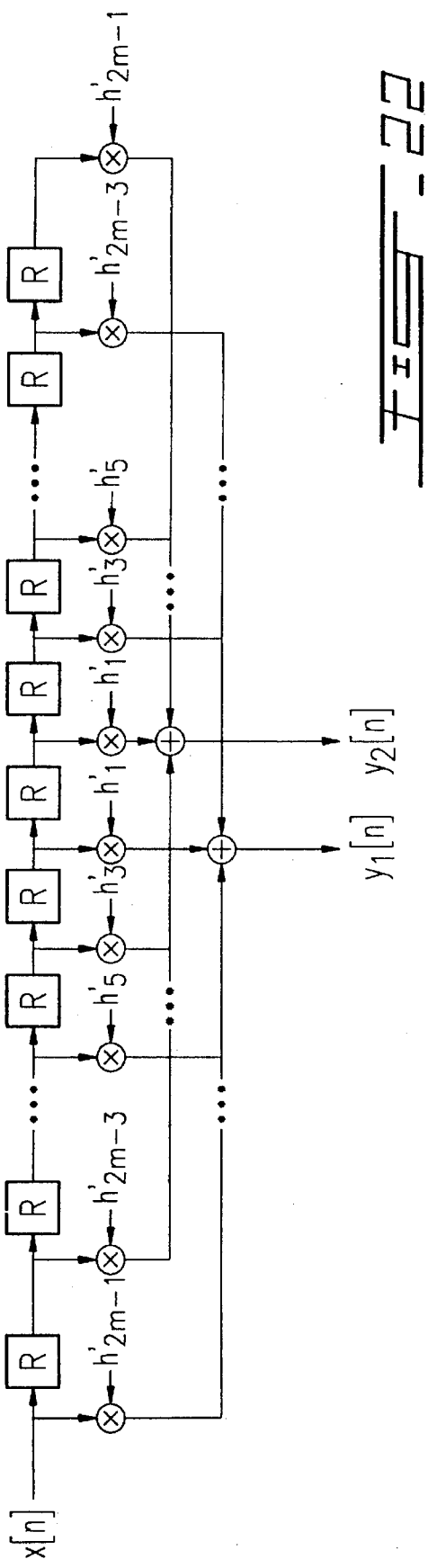
FIG. 22 illustrates the upper filter of FIG. 21 before modification.
Figure 23:
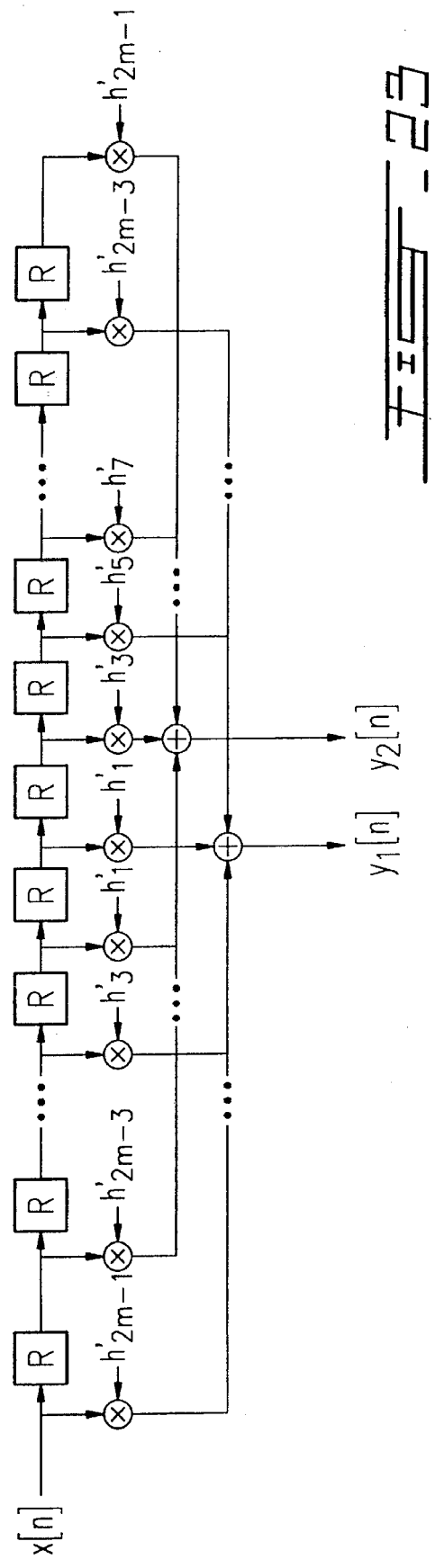
FIG. 23 illustrates a canonic implementation of the upper filter of FIG. 20.

FIGS. 22 and 23 show the upper section of the filters of FIGS. 20 and 21, respectively. As before, we denote the input to this section by x[n] and its outputs by $y_1[n]$ and $y_2[n]$.

For odd m, we can write $y_1[n]$ and $y_2[n]$ as, $$y_1[n] = h'_{2m-1} x[n] + h'_{2m-5} x[n-2] + \ldots \tag{30}$$

$$h'_5 x[n-m+3] + h'_1 x[n-m+1] +$$

$$h'_3 x[n-m-1] + \ldots + h'_{2m-3} x[n-2m+2],$$

and $$y_2[n] = h'_{2m-3} x[n-1] + h'_{2m-7} x[n-3] + \ldots \tag{31}$$

$$h'_3 x[n-m+2] + h'_1 x[n-m] +$$

$$h'_5 x[n-m-2] + \ldots + h'_{2m-1} x[n-2m+1].$$

Substituting n+1 for n in (31), we get, $$y_2[n+1] = h'_{2m-3} x[n] + h'_{2m-7} x[n-2] + \ldots \tag{32}$$

$$h'_3 x[n-m+3] + h'_1 x[n-m+1] + h'_5 x[n-m-1] + \ldots +$$

$$h'_{2m-1} x[n-2m+2].$$

Combining (30) and (32), we get, $$z_1[n] = \frac{y_2[n+1] + y_1[n]}{2} = \tag{33}$$

$$\frac{1}{2} (h'_{2m-3} + h'_{2m-1})\{x[n] + x[n-2m+2]\} +$$

$$\frac{1}{2} (h'_{2m-7} + h'_{2m-5})\{x[n-2] +$$

$$x[n-2m+4]\} + \ldots h'_1 x[n-m+1]$$

and $$z_2[n] = \frac{y_2[n+1] - y_1[n]}{2} = \tag{34}$$

$$\frac{1}{2} (h'_{2m-3} - h'_{2m-1})\{x[n] - x[n-2m+2]\} +$$

$$\frac{1}{2} (h'_{2m-7} - h'_{2m-5})\{x[n-2] - x[n-2m+4]\} +$$

$$\ldots + \frac{1}{2} (h'_3 - h'_5)\{x[n-m+3] - x[n-m-1]\}.$$

Now, instead of using (30) and (31) to find $y_1[n]$ and $y_2[n]$, we can use (33) and (34) to find $z_1[n]$ and $z_2[n]$. Then, $y_1[n]$ and $y_2[n+1]$ can be found using (27) and (28) and $y_2[n+1]$ can be delayed in order to obtain $y_2[n]$.

In order to make the above presentation more clear, we introduce the following parameters, for odd m:

$$g_1 = h'_1 \tag{35}$$

$$g_2 = \frac{h'_3 - h'_5}{2}$$

$$g_3 = \frac{h'_3 + h'_5}{2}$$

$$g_4 = \frac{h'_7 - h'_9}{2}$$

$$g_5 = \frac{h'_7 + h'_9}{2}$$

$$\vdots$$

$$g_{m-1} = \frac{h'_{2m-3} - h'_{2m-1}}{2}$$

$$g_m = \frac{h'_{2m-3} + h'_{2m-1}}{2}$$

Then (23) and (24) can be written as, $$z_1[n] = g_m\{x[n] + x[n-2m+2]\} + g_{m-2}\{x[n-2] + \quad (36)$$
$$x[n-2m+4]\} + \ldots + g_1 x[n-m+1],$$

and $$z_2[n] = g_{m-1}\{x[n] - x[n-2m+2]\} + g_{m-3}\{x[n-2] - \quad (37)$$
$$x[n-2m+4]\} + \ldots + g_2\{x[n-m+3] - x[n-m-1]\}.$$

Figure 24:
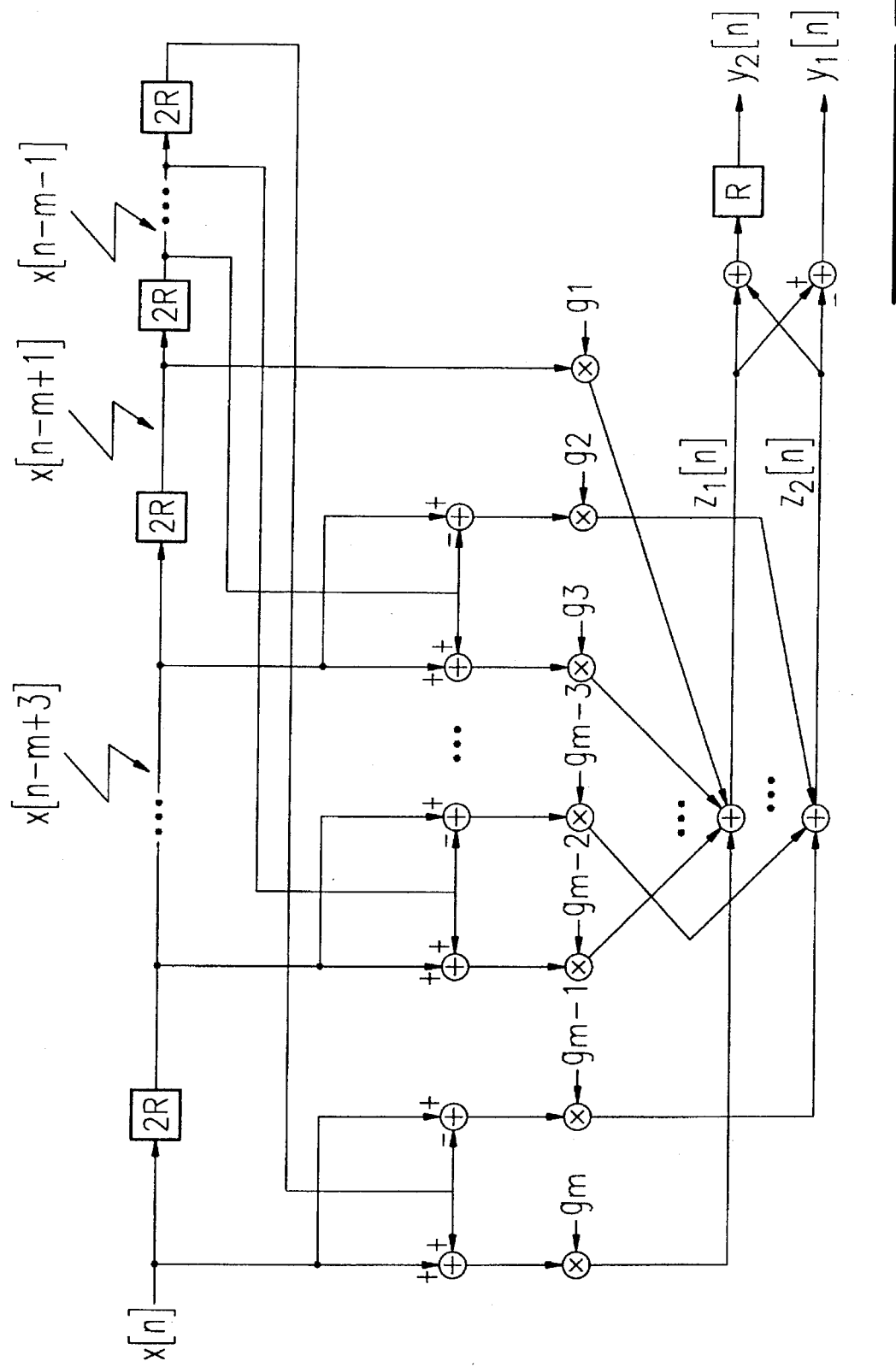
FIG. 24 illustrates a canonic implementation of the upper filter of FIG. 20.

FIG. 24 shows the implementation of the upper section of the half-band filter of FIG. (20), i.e., for odd m. The lower section of FIG. (20) will be exactly the same. For the sake of brevity, we do not repeat the lower section.

For even m, $y_1[n]$ and $y_2[n+1]$ are given as, $$y_1[n] = h'_{2m-1}x[n] + h'_{2m-5}x[n-2] + \ldots + \quad (38)$$
$$h'_3 x[n-m+2] + h'_1 x[n-m] +$$
$$h'_5 x[n-m-2] + \ldots + h'_{2m-3}x[n-2m+2],$$

and $$y_2[n+1] = h'_{2m-3}x[n] + h'_{2m-7}x[n-2] + \ldots + \quad (39)$$
$$h'_1 x[n-m+2] + h'_3 x[n-m] + h'_7 x[n-m-2] + \ldots +$$
$$h'_{2m-1}x[n-2m+2].$$

Combining (38) and (39), we get, $$z_1[n] = \frac{y_2[n+1] + y_1[n]}{2} = \quad (40)$$
$$\frac{1}{2}(h'_{2m-3} + h'_{2m-1})\{x[n] + x[n-2m+2]\} +$$
$$\frac{1}{2}(h'_{2m-7} + h'_{2m-5})\{x[n-2] +$$
$$x[n-2m+4]\} + \ldots \frac{1}{2}(h'_1 + h'_3)\{x[n-m+2] + x[n-m]\},$$

and $$z_2[n] = \frac{y_2[n+1] - y_1[n]}{2} = \quad (41)$$
$$\frac{1}{2}(h'_{2m-3} - h'_{2m-1})\{x[n] - x[n-2m+2]\} +$$
$$\frac{1}{2}(h'_{2m-7} - h'_{2m-5})\{x[n-2] - x[n-2m+4]\} +$$
$$\ldots + \frac{1}{2}(h'_1 - h'_3)\{x[n-m+2] - x[n-m]\}.$$

For even m, we introduce the following parameters:

$$g_1 = \frac{h'_1 - h'_3}{2} \quad (42)$$

$$g_2 = \frac{h'_1 + h'_3}{2}$$

$$g_3 = \frac{h'_5 - h'_7}{2}$$

$$g_4 = \frac{h'_5 + h'_7}{2}$$

⋮

$$g_{m-1} = \frac{h'_{2m-3} - h'_{2m-1}}{2}$$

$$g_m = \frac{h'_{2m-3} + h'_{2m-1}}{2}$$

Then $z_1[n]$ and $z_2[n]$ can be written as, $$z_1[n] = g_m\{x[n] + x[n-2m+2]\} + g_{m-2}\{x[n-2] + x[n-2m+4]\} + \ldots + g_2\{x[n-m+2] + x[n-m]\}, \quad (43)$$

and $$z_2[n] = g_{m-1}\{x[n] - x[n-2m+2]\} + g_{m-3}\{x[n-2] - x[n-2m+4]\} + \ldots + g_1\{x[n-m+2] - x[n-m]\}. \quad (44)$$

FIG. 25 shows the canonic implementation of the upper section of the half-band filter of the FIG. 21, i.e., for even m. The lower section of the FIG. 21 will be exactly the same. Again, for the sake of brevity, we do not repeat the lower section.

From FIGS. 24 and 25, it can be seen that for both odd and even m, the number of multipliers required for each section is equal to m. Therefore, the total number of multipliers required for the canonic implementation of a half-band filter of order N=4m−1 is equal to 2m instead of 4m.

The above described structures may also be used for demultiplexing of several signals into a single frequency multiplexed signal. Transforming the demultiplexer into a multiplexer to perform the above-mentioned process is done through a transformation called transposition. Such transformation, i.e., the transposition is well known to one skilled in the art. Accordingly, this invention also includes a development of any multiplexer which is the transposition of the above-described demultiplexer.

Although a particular embodiment has been described, this was for the purpose of illustrating, but not limiting, the invention. Various modifications, which will come readily to the mind of one skilled in the art, are within the scope of the invention as defined in the appended claims.

We claim:

1. A half-band filter of order N=4m−1, where m is any positive integer, for use in a cellular group demultiplexer for demultiplexing N-channel frequency multiplexed signals including even and odd numbered samples, the even and odd numbered samples each having real and imaginary parts, said half-band filter comprising:

signal receiving means for separately receiving the real and imaginary parts of the odd numbered samples and for separately receiving the real and imaginary parts of the even numbered samples, said signal receiving means having an upper output and a lower output;

an upper half having an input and an output, said input of said upper half being connected to said upper output of said signal receiving means;

a lower half having an input and an output, said input of said lower half being connected to said lower output of said signal receiving means; and signal combining/outputting means for combining signals exiting said outputs of said upper and lower halves and for outputting signals $A_\theta{}^r(-jz^2)$, $A_\theta{}^i(-jz^2)$, $B_\theta{}^r(-jz^2)$, $B_\theta{}^i(-jz^2)$, an input of said signal combining/outputting means being connected to said outputs of said upper and lower halves;

said signal receiving means comprising:
first adder means for adding the real and imaginary parts of the odd numbered samples to obtain a signal $x_{1\ up}[n]$ at said upper output;

first subtracter means for subtracting the real part of the odd numbered samples from the imaginary part of the odd numbered samples to obtain a signal $x_{1\ low}$ [n] at said lower output;

means for passing the real part of the even numbered samples to a delaying/dividing means of said upper half; and means for passing the imaginary part of the even numbered samples to a delaying/dividing means of said lower half;

said upper half comprising:

an upper filter section, said upper filter section receiving the signal $x_{1\ up}$ [n] from said signal receiving means and outputting signals $y_{1\ up}$ [n] and $y_{2\ up}$ [n] to said signal combining/outputting means; and delaying/dividing means for dividing by two and for delaying the real part of the even numbered samples such that the delayed and divided real part of the even numbered samples arrive at said input of said signal combining/outputting means in timed coordination with the odd numbered samples of signals $y_{1\ up}$ [n] and $y_{2\ up}$ [n];

said lower half comprising:

a lower filter section which is symmetric with said upper filter section, said lower filter section receiving the signal $x_{1\ low}$ [n] from said signal receiving means, and outputting signals $y_{1\ low}$ [n] and $y_{2\ low}$ [n] to said signal combining/outputting means; and delaying/dividing means for dividing by two and for delaying the imaginary part of the even numbered samples such that the delayed and divided imaginary part of the even numbered samples arrive at said input of said signal combining/outputting means in timed coordination with the odd numbered samples of signals $y_{1\ low}$ [n] and $y_{2\ low}$ [n];

each of said upper and lower filter sections comprising:

m−1 serially connected shift registers, each of said m−1 shift registers for delaying signal samples passing therethrough by 2 kT, wherein T is the time duration between two successive samples, the input to the first of said m−1 shift registered receiving the signal $x_{1\ up/low}$ [n] from said upper/lower outputs of said signal receiving means;

filter section adder means;

filter section subtracter means;

m multipliers, each of said m multipliers for multiplying signal samples passing therethrough by a coefficient, the inputs to the m, (m−2), . . . and 1st (for odd m), or 2nd (for even m), multipliers being connected to said m−1 shift registers via said filter section adder means and the inputs to the (m−1), (m−3), . . . and 1st multipliers being connected to said m−1 shift registers via said filter section subtractor means such that the signal samples entering said m multiplier are obtained by adding the signal samples exiting the last of said m−1 shift registers to the signal samples entering the first of said m−1 shift registers, such that the signal samples entering said (m−1) multiplier are obtained by subtracting the signal samples exiting said last of said m−1 shift registers from the signal samples entering said first of said m−1 shift registers, such that the signal samples entering said (m−2) multiplier are obtained by adding the signal samples exiting the penultimate of said m−1 shift registers to the signal samples entering the second of said m−1 shift registers, such that the signal samples entering said (m−3) multiplier are obtained by subtracting said signal samples exiting the penultimate of said m−1 shift registers from the signal samples entering said second of said m−1 shift registers and so forth, . . . ; and means for combining the signal samples exiting said m multipliers to obtain signals $y_{1\ up/low}$ [n] and $y_{2\ up/low}$ [n].

2. A half-band filter as defined in claim 1, wherein said combining/outputting means of said half-band filter comprises:

first intermediate subtracter means for subtracting the signal $y_{1\ low}$ [n] from the signal $y_{2\ up}$ [n] to obtain a first intermediate signal;

first intermediate adder means for adding the signal $y_{2\ low}$ [n] to the signal $y_{1\ up}$ [n] to obtain a second intermediate signal;

second intermediate adder means for adding the signal $y_{1\ low}$ [n] to the signal $y_{2\ up}$ [n] to obtain a third intermediate signal;

second intermediate subtracter means for subtracting the signal $y_{2\ low}$ [n] from the signal $y_{1\ up}$ [n] to obtain a fourth intermediate signal;

first output adder means for adding the imaginary part of the delayed and divided even numbered samples to the first intermediate signal to obtain a first output signal $A_\theta^r(-jz^2)$;

first output subtracter means for subtracting the real part of the delayed and divided even numbered samples from the second intermediate signal to obtain a second output signal $A_\theta^i(-jz^2)$;

second output subtracter means for subtracting the real part of the delayed and divided even numbered samples from the third intermediate signal to obtain a third output signal;

second output adder means for adding the imaginary part of the delayed and divided even numbered samples to the fourth intermediate signal to obtain a fourth output signal; and final multiplier means for alternately multiplying each of the third and fourth output signals by +1 and −1 to obtain third and fourth final output signals $B_\theta^i(-jz^2)$ and $B_\theta^r(-jz^2)$ respectively.

3. A group demultiplexer comprised of the demultiplexer defined in claim 2, wherein each demultiplexer cell is cascaded in different stages using interfacing buffers, wherein the output of a first stage is sent to the input of a second stage, such that when a frequency multiplexed composite signal is fed at the input of a first stage, a dual output signal of one-half the frequency of the input signal is obtained at the output of the first stage.

4. A half-band filter as defined in claim 1, wherein for odd integers of m, the multiplier coefficient of said first of said m multipliers represents a number obtained by dividing the first multiplier coefficient of a standard half-band filter of order N by the square-root of two, and the multiplier coefficient of said second of said m multipliers represents a number obtained by subtracting the fifth multiplier coefficient of the standard half-band filter from the third multiplier coefficient of the standard half-band filter and dividing the result by the square-root of eight, and so on.

5. A half-band filter as defined in claim 4, wherein said means for combining the signal samples exiting said m multipliers to obtain signals $y_{1\ up/low}$ [n] and $y_{2\ up/low}$ [n] of each of said upper and lower filter sections comprises:

third and fourth adder means for adding the signal samples exiting the odd and even numbered multipliers, respectively;

fifth adder means for adding the signal samples exiting said fourth adder means to the signal samples exiting said third adder means;

shift register means for delaying the signal samples exiting said fifth adder means by kT to obtain the signal $y_{2\ up/low}[n]$, wherein T is the time duration between two successive samples;

third subtractor means for subtracting the signal samples exiting said third adder means from the signal samples exiting said fourth adder means to obtain the signal $y_{1\ up/low}[n]$.

6. A half-band filter as defined in claim 1, wherein for even integers of m, the multiplier coefficient of said first of said m multipliers represents a number obtained by subtracting the third multiplier coefficient of a standard half-band filter of order N from the first multiplier coefficient of the standard half-band filter and dividing the result by the square-root of eight, and the multiplier coefficient of said second of said m multipliers represents a number obtained by adding the first and third multiplier coefficients of the standard half-band filter and dividing the result by the square-root of eight, and so on.

7. A half-band filter as defined in claim 6, wherein said means for combining the signal samples exiting said m multipliers to obtain signals $y_{1\ up/low}[n]$ and $y_{2\ up/low}[n]$ of each of said upper and lower filter sections comprises:

third and fourth adder means for adding the signal samples exiting the odd and even numbered multipliers, respectively;

fifth adder means for adding the signal samples exiting said fourth adder means to the signal samples exiting said third adder means;

shift register means for delaying the signal samples exiting said fifth adder means by kT to obtain the signal $y_{2\ up/low}[n]$, wherein T is the time duration between two successive samples;

third subtractor means for subtracting the signal samples exiting said third adder means from the signal samples exiting said fourth adder means to obtain the signal $y_{1\ up/low}[n]$.

8. A half-band filter of order N=4 m−1, where m is any positive odd integer, for use in a cellular group demultiplexer for demultiplexing N-channel frequency multiplexed signals including even and odd numbered samples, the even and odd numbered samples each having real and imaginary parts, said half-band filter comprising:

signal receiving means for separately receiving the real and imaginary parts of the odd numbered samples and for separately receiving the real and imaginary parts of the even numbered samples, said signal receiving means having an upper output and a lower output;

an upper half having an input and an output, said input of said upper half being connected to said upper output of said signal receiving means;

a lower half having an input and an output, said input of said lower half being connected to said lower output of said signal receiving means; and signal combining/outputting means for combining the signals exiting said output of said upper and lower halves and for outputting signals $A_\theta^r(-jz^2)$, $A_\theta^i(-jz^2)$, $B_\theta^r(-jz^2)$, $B_\theta^i(-jz^2)$, an input of said signal combining/outputting means being connected to said outputs of said upper and lower halves;

said signal receiving means comprising:
first adder means for adding the real and imaginary parts of the odd numbered samples to obtain a signal $x_{1\ up}[n]$ at said upper output of said signal receiving means;

first subtracter means for subtracting the real part of the odd numbered samples from the imaginary part of the odd numbered samples to obtain a signal $x_{1\ low}[n]$ at said lower output of said signal receiving means;

means for passing the real part of the even numbered samples to a delaying/dividing means of said upper half; and means for passing the imaginary part of the even numbered samples to a delaying/dividing means of said lower half;

said upper half comprising:
an upper filter section, said upper filter section receiving the signal $x_{1\ up}[n]$ from said signal receiving means and outputting signals $y_{1\ up}[n]$ and $y_{2\ up}[n]$ to said signal combining/outputting means; and delaying/dividing means for dividing by two and for delaying the real part of the even numbered samples such that the divided real part of the even numbered samples arrive at said input of said signal combining/outputting means in timed coordination with the odd numbered samples of signals $y_{1\ up}[n]$ and $y_{2\ up}[n]$;

said lower half comprising:
a lower filter section which is symmetric with said upper filter section, said lower filter section receiving the signal $x_{1\ low}[n]$ from said signal receiving means, and outputting signals $y_{1\ low}[n]$ and $y_{2\ low}[n]$ to said signal combining/outputting means; and delaying/dividing means for dividing by two and for delaying the imaginary part of the even numbered samples such that the divided imaginary part of the even numbered samples arrive at said input of said signal combining/outputting means in timed coordination with the odd numbered samples of signals $y_{1\ low}[n]$ and $y_{2\ low}[n]$;

each of said upper and lower filter sections comprising:
m−1 serially connected shift registers for delaying signal samples passing therethrough by 2 kT, wherein T is the time duration between two successive samples, the input to the first of said m−1 shift registers receiving the signal $x_{1\ up/low}[n]$ from said upper/lower outputs of said signal receiving means;

a first set and a second set of multipliers, said first set of multipliers consisting of m multipliers and said second set of multipliers consisting of (m−1)/2 multipliers, each multiplier of said first and second sets of multipliers for multiplying signal samples passing therethrough by a coefficient, the input of the first multiplier of said first set of multipliers being connected to the input of the first of said m−1 shift registers, the input of the second multiplier of said first set of multipliers being connected to the output of said first of said m−1 shift registers and the input of the second of said m−1 shift registers, the input of the third multiplier of said first set of multipliers being connected to the output of said second of said m−1 shift registers and the input of the third of said m−1 shift registers, and so forth . . . , and the input of the m multiplier of said first set of multipliers being connected to the output of the last of said m−1 shift registers;

first filter section subtracter means for subtracting the signal samples exiting said last of said m−1 shift registers from the signal samples entering said first of said m−1 shift registers to obtain the signal samples entering the first multiplier of said second set of multipliers;

second filter section subtracter means for subtracting the signal samples exiting the penultimate of said m−1 shift-registers from the signal samples entering said second of said m−1 shift registers to obtain the signal samples entering the second multiplier of said second set of multipliers;

third, fourth, . . . , (m−1)/2 filter section subtracter means for obtaining signal samples entering the third, fourth . . . , (m−1)/2 multipliers of said second set of multipliers, wherein the nth subtracter means forms the signal samples entering the n multiplier of said second set of multipliers, where n is an integer between 3, . . . , (m−1)/2; and means for combining the signal samples exiting each of said multipliers in said first and second sets of multipliers to obtain signals $y_{1\ up/low}$ [n] and $y_{2\ up/low}$ [n].

9. A half-band filter as defined in claim 8, wherein for odd integers of m, the coefficient of each multiplier in said first and second sets of multipliers represents a number derived from the odd multiplier coefficients of a standard half-band filter of order N, the coefficients of said m multipliers of said first set of multipliers representing numbers obtained by dividing each of the (2m−1), (2m−5), (2m−9), . . . , fifth, first, third, . . . , (2m−7), (2m−3) multiplier coefficients of the standard half-band filter by the square-root of two;

the coefficient of the first multiplier of said second set of multipliers representing a number obtained by subtracting the (2m−1) multiplier coefficient of the standard half-band filter from the (2m−3) multiplier coefficient of the standard half-band filter and dividing the result by the square-root of two;

the coefficient of the second multiplier of said second set of multipliers representing a number obtained by subtracting the (2m−5) multiplier coefficient of the standard half-band filter from the (2m−7) multiplier coefficient of the standard half-band filter and dividing the result by the square-root of two, and so on, . . . ; and the coefficient of the last multiplier of said second set of multipliers representing a number obtained by subtracting the fifth multiplier coefficient of the standard half-band filter from the third multiplier coefficient of the standard half-band filter and dividing the result by the square-root of two.

10. A half-band filter as defined in claim 9 wherein said means for combining the signal samples exiting each of said multipliers in said first and second sets of multipliers to obtain signals $y_{1\ up/low}$ [n] and $y_{2\ up/low}$ [n] of each of said upper and lower filter sections comprises:

first filter section adder means for adding the signal samples exiting said m multipliers of said first set of multipliers to obtain the signal $y_{1\ up/low}$ [n];

section filter section adder means for adding the signals $y_{1\ up/low}$ [n] to the signal samples exiting said (m−1)/2 multiplier of said second set of multipliers to obtain a signal $y_{2\ up/low}$ [n+1];

shift register means for delaying the signal $y_{2\ up/low}$ [n+1] by kT to obtain the signal $y_{2\ up/low}$ [n], where T is the time duration between two successive samples.

11. A half-band filter of order N=4m−1, where m is any positive even integer, for use in a cellular group demultiplexer for demultiplexing N-channel frequency multiplexed signals including even and odd numbered samples, the even and odd numbered samples each having real and imaginary parts, said half-band filter comprising:

signal receiving means for separately receiving the real and imaginary parts of the odd numbered samples and for separately receiving the real and imaginary parts of the even numbered samples, said signal receiving means having an upper output and a lower output;

an upper half having an input and an output, said input of said upper half being connected to said upper output of said signal receiving means;

a lower half having an input and an output, said input of said lower half being connected to said lower output of said signal receiving means; and signal combining/outputting means for combining signals exiting said upper and lower halves and for outputting signals $A_\theta^r(-jz^2)$, $A_\theta^i(-jz^2)$, $B_\theta^r(-jz^2)$, $B_\theta^i(-jz^2)$, an input of said signal combining/outputting means being connected to said outputs of said upper and lower halves;

said signal receiving means comprising:

first adder means for adding the real and imaginary parts of the odd numbered samples to obtain a signal $x_{1\ up}$ [n];

first subtracter means for subtracting the real part of the odd numbered samples from the imaginary part of the odd numbered samples to obtain a signal $x_{1\ low}$ [n];

means for passing the real part of the even numbered samples to a delaying/dividing means of said upper half; and means for passing the imaginary part of the even numbered samples to a delaying/dividing means of said lower half;

said upper half comprising:

an upper filter section, said upper filter section receiving the signal $x_{1\ up}$ [n] from said signal receiving means and outputting signals $y_{1\ up}$ [n] and $y_{2\ up}$ [n] to said signal combining/outputting means; and delaying/dividing means for dividing by two and for delaying the real part of the even numbered samples such that the delayed and divided real part of the even numbered samples arrive at said input of said combining/outputting means in timed coordination with the odd numbered samples of signals $y_{1\ up}$ [n] and $y_{2\ up}$ [n];

said lower half comprising:

a lower filter section which is symmetric with said upper filter section, said lower filter section receiving the signal $x_{1\ low}$ [n] from said signal receiving means, and outputting signals $y_{1\ low}$ [n] and $y_{2\ low}$ [n] to said signal combining/outputting means; and delaying/dividing means for dividing by two and for delaying the imaginary part of the even numbered samples such that the delayed and divided imaginary part of the even numbered samples arrive at said input of said combining/outputting means in timed coordination with the odd numbered samples of signals $y_{1\ low}$ [n] and $y_{2\ low}$ [n];

each of said upper and lower filter sections comprising:

m−1 serially connected shift registers for delaying signal samples passing therethrough by 2 kT, wherein T is the time duration between two successive samples, the input to the first of said m−1 shift registers receiving the signal $x_{1\ up/low}$ [n] from said upper/lower outputs of said signal receiving means;

a first and a second set of multipliers, said first set of multipliers consisting of m multipliers and said second set of multipliers consisting of m/2 multipliers, each multiplier of said first and second sets of multipliers for multiplying signal samples passing therethrough by a coefficient;

the input of the first multiplier of said first set of multipliers being connected to the input of the first of said m−1 first shift registers, the input of the second multiplier of said first set of multipliers being connected to the output of said first of said m−1 shift registers and the input of the second of said m−1 shift registers, the input of the third multiplier of said first set of multipliers being connected to the output of said second of said m−1 shift registers and the input of the third of said m−1 shift registers, . . . , and the input of the m multiplier of said first set of multipliers being connected to the output of the last of said m−1 shift registers;

second subtracter means for subtracting the signal samples exiting said last of said m−1 shift registers from the signal samples entering said first of said m−1 shift registers to obtain the signal samples entering the first multiplier of said second set of multipliers;

third subtracter means for subtracting the signal samples exiting the penultimate of said m−1 shift registers from the signal samples entering said second of said m−1 shift registers to obtain a signal samples entering the second multiplier of said second set of multipliers; and fourth, fifth, . . . , m/2 subtracter means for obtaining the signal samples entering the third, fourth, . . . , m/2 multipliers of said second set of multipliers; and means for combining the signal samples exiting said first and second sets of multipliers to obtain signals $y_{1\ up/low}[n]$ and $y_{2\ up/low}[n]$.

12. A half-band filter as defined in claim 11, wherein for even integers of m, the coefficient of each multiplier in said first and second sets of multipliers represents a number derived from the odd multiplier coefficients of a standard half-band filter of order N, the coefficients of said m multipliers of said first set of multipliers representing numbers obtained by dividing each of the (2m−1), (2m−5), (2m−9) . . . , third, first, fifth, . . . , (2m−7), (2m−3) multiplier coefficients of the standard half-band filter by the square-root of two;

the coefficient of the first multiplier of said second set of multipliers representing a number obtained by subtracting the (2m−1) multiplier coefficient of the standard half-band filter from the (2m−3) multiplier coefficient of the standard half-band filter and dividing the result by the square-root of two;

the coefficient of the second multiplier of said second set of multipliers representing a number obtained by subtracting the (2m−5) multiplier coefficient of the standard half-band filter from the (2m−7) multiplier coefficient of the standard half-band filter and dividing the result by the square-root of two, and so on, . . . and the coefficient of the last multiplier of said second set of multipliers representing a number obtained by subtracting the third multiplier coefficient of the standard half-band filter from the first multiplier coefficient of the standard half-band filter and dividing the result by the square-root of two.

13. A half-band filter as defined in claim 12 wherein said means for combining the signal samples exiting each of said multipliers in said first and second sets of multipliers to obtain signals $y_{1\ up/low}[n]$ and $y_{2\ up/low}[n]$ of each of said upper and lower filter sections comprises:

first filter section adder means for adding the signal samples exiting said m multipliers of said first set of multipliers to obtain the signal $y_{1\ up/low}[n]$;

second filter section adder means for adding the signal samples $y_{1\ up/low}[n]$ to the signal samples exiting said m/2 multiplier of said second set of multipliers to obtain a signal $y_{2\ up/low}[n+1]$;

shift register means for delaying the signal $y_{2\ up/low}[n]+1$ by kT to obtain the signal $y_{2\ up/low}[n]$, where T is the time duration between two successive samples.

* * * * *